(12) United States Patent
Suzuki et al.

(10) Patent No.: US 9,429,867 B2
(45) Date of Patent: Aug. 30, 2016

(54) SEMICONDUCTOR APPARATUS, EXPOSING HEAD, AND IMAGE FORMING APPARATUS

(71) Applicant: Oki Data Corporation, Tokyo (JP)

(72) Inventors: Takahito Suzuki, Tokyo (JP); Taishi Kaneto, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 14/669,723

(22) Filed: Mar. 26, 2015

(65) Prior Publication Data

US 2015/0277269 A1 Oct. 1, 2015

(30) Foreign Application Priority Data

Mar. 27, 2014 (JP) .................. 2014-066789
Mar. 27, 2014 (JP) .................. 2014-066790

(51) Int. Cl.
*G03G 15/04* (2006.01)
*G03G 15/043* (2006.01)
*F21V 23/06* (2006.01)
*F21V 21/00* (2006.01)
*F21Y 103/00* (2016.01)

(52) U.S. Cl.
CPC ............. *G03G 15/043* (2013.01); *F21V 21/00* (2013.01); *F21V 23/06* (2013.01); *G03G 15/04054* (2013.01); *F21Y 2103/003* (2013.01)

(58) Field of Classification Search
CPC .................. G03G 15/0454; G03G 15/04054
USPC ............................................... 439/73
See application file for complete search history.

(56) References Cited

U.S. PATENT DOCUMENTS

| | | | | | |
|---|---|---|---|---|---|
| 5,972,729 | A | * | 10/1999 | Shimizu | B41J 2/45 257/620 |
| 5,997,152 | A | * | 12/1999 | Taninaka | B41J 2/45 257/88 |
| 7,180,099 | B2 | * | 2/2007 | Ogihara | B41J 2/45 257/72 |

FOREIGN PATENT DOCUMENTS

| | | |
|---|---|---|
| JP | 2007-294876 A | 11/2007 |
| JP | 2011-131475 A | 7/2011 |

* cited by examiner

*Primary Examiner* — Clayton E Laballe
*Assistant Examiner* — Leon W Rhodes, Jr.
(74) *Attorney, Agent, or Firm* — Panitch Schwarze Belisario & Nadel

(57) ABSTRACT

A semiconductor apparatus includes a rectangular plate-like body including a major surface. A plurality of light emitting portions formed in the major surface, and aligned in a straight line. A first terraced portion and a second terraced portion are formed in the major surface except areas in which the plurality of light emitting portions are formed.

21 Claims, 23 Drawing Sheets

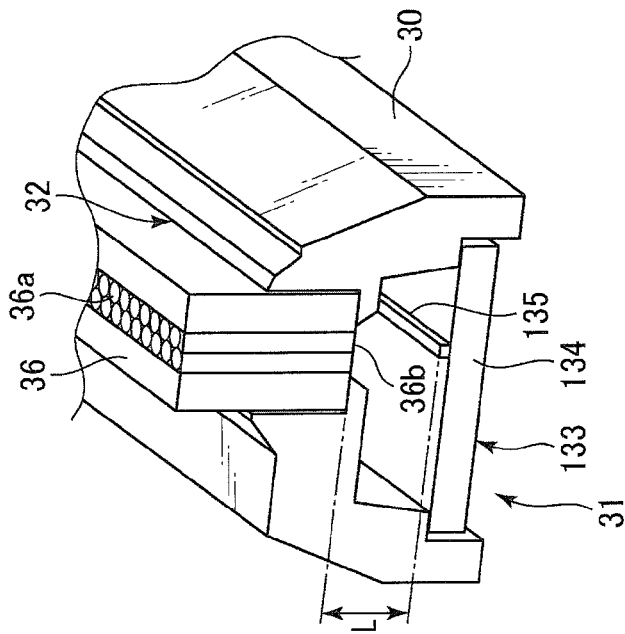
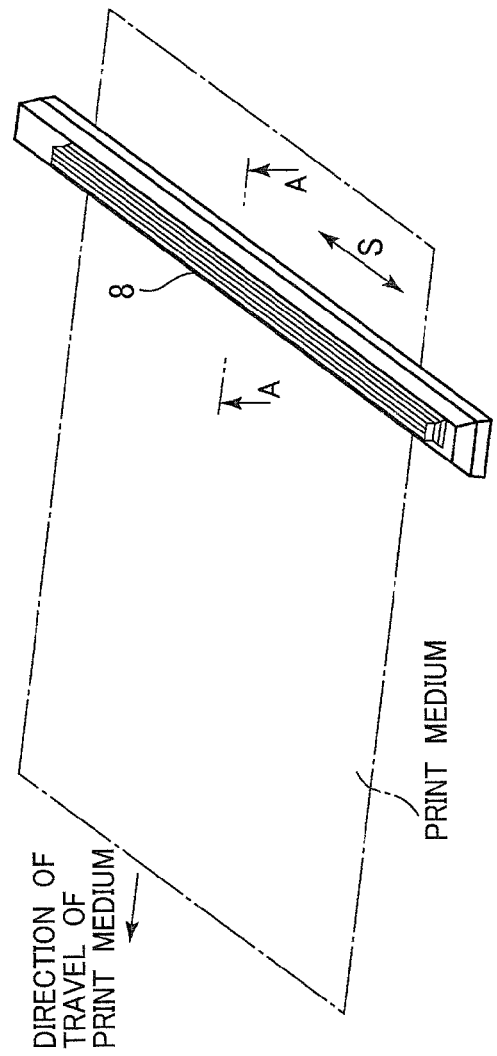

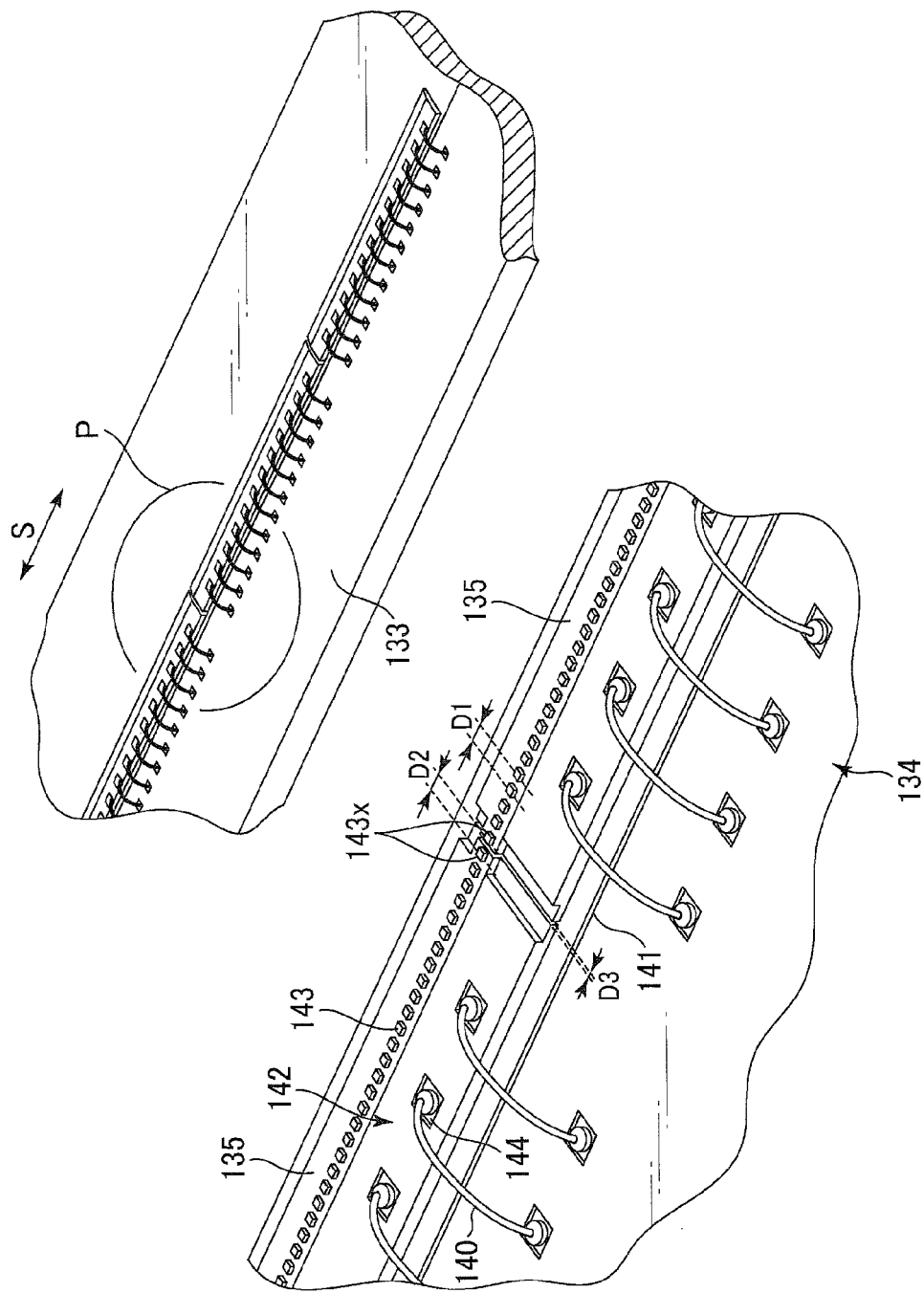

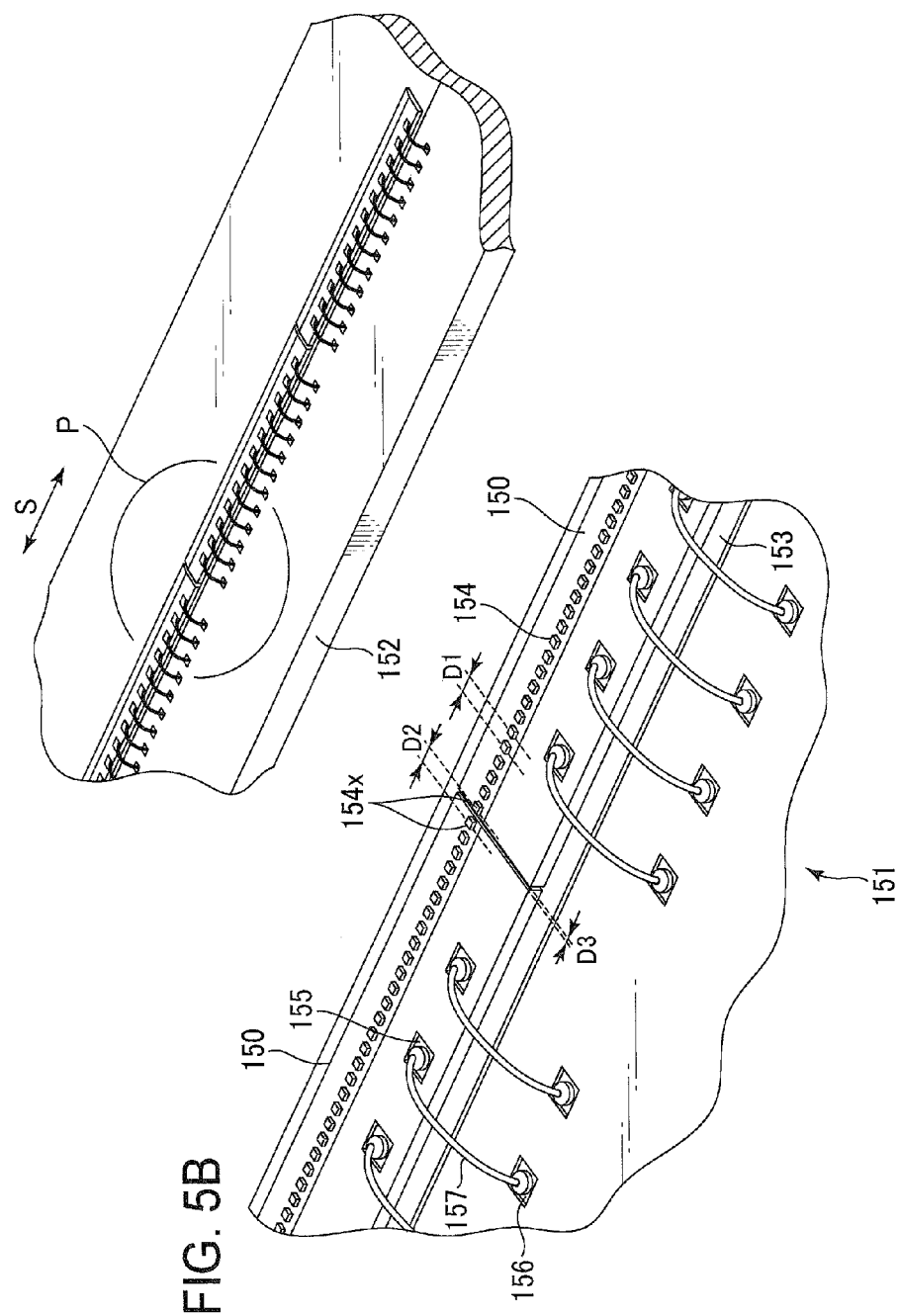

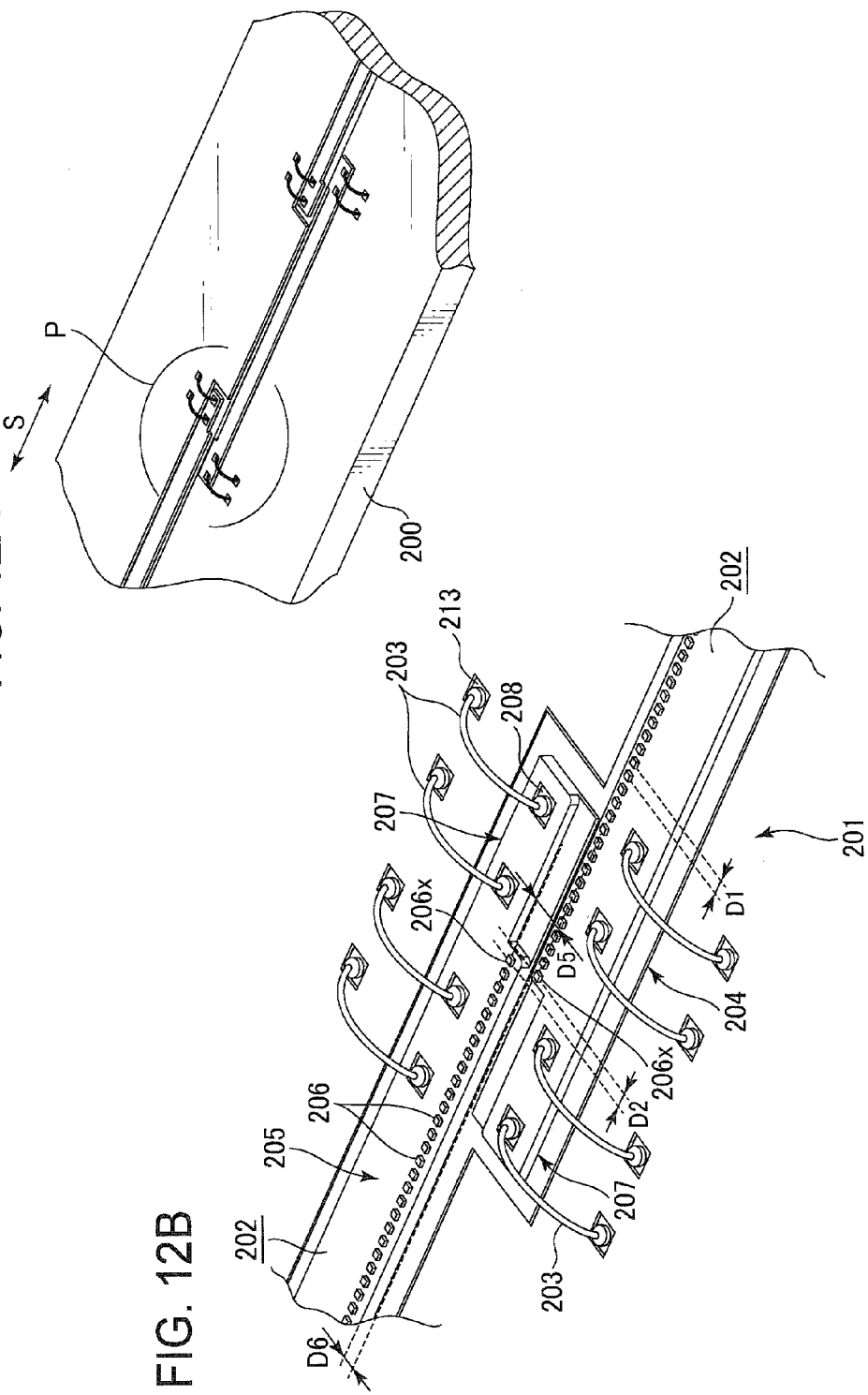

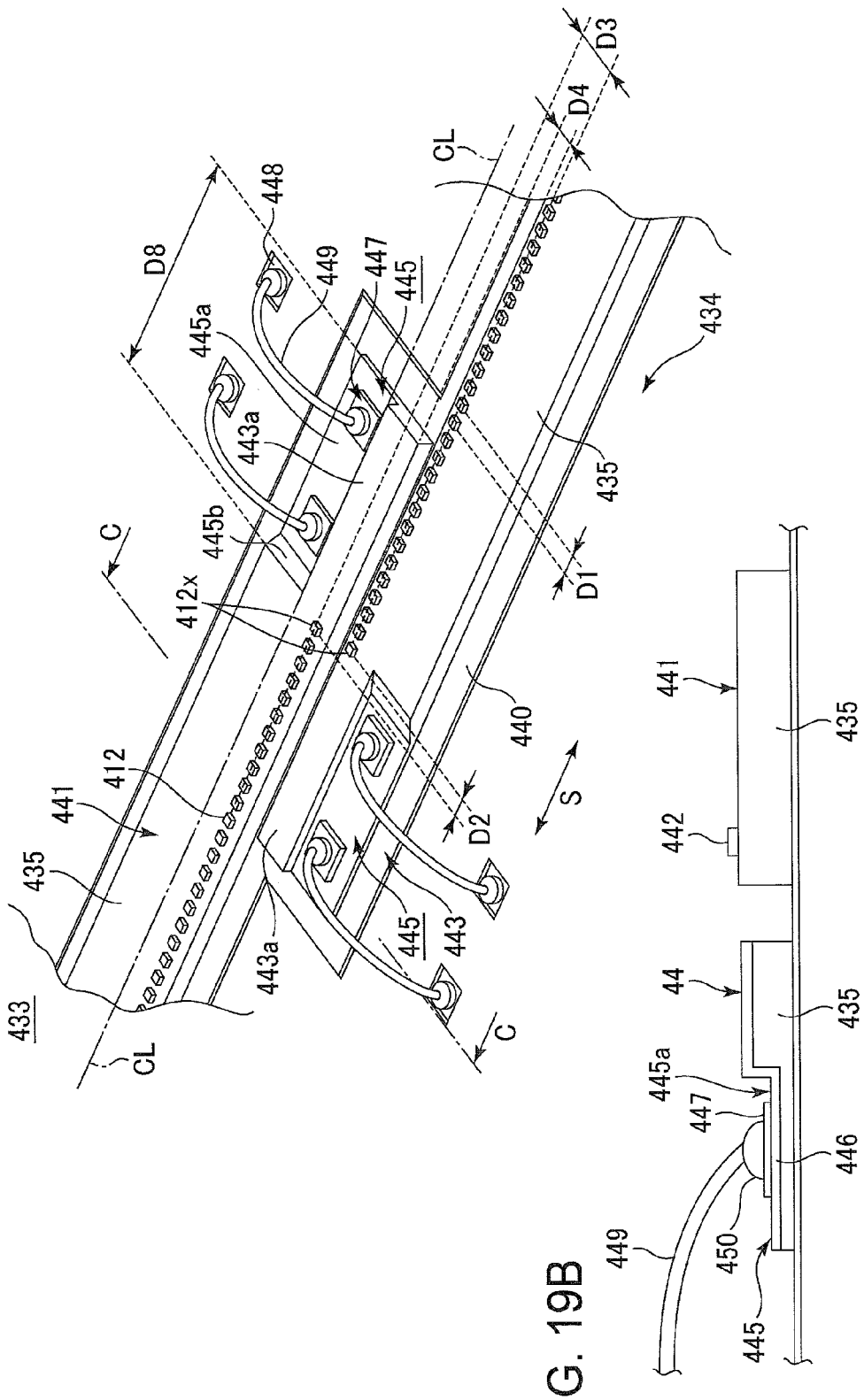

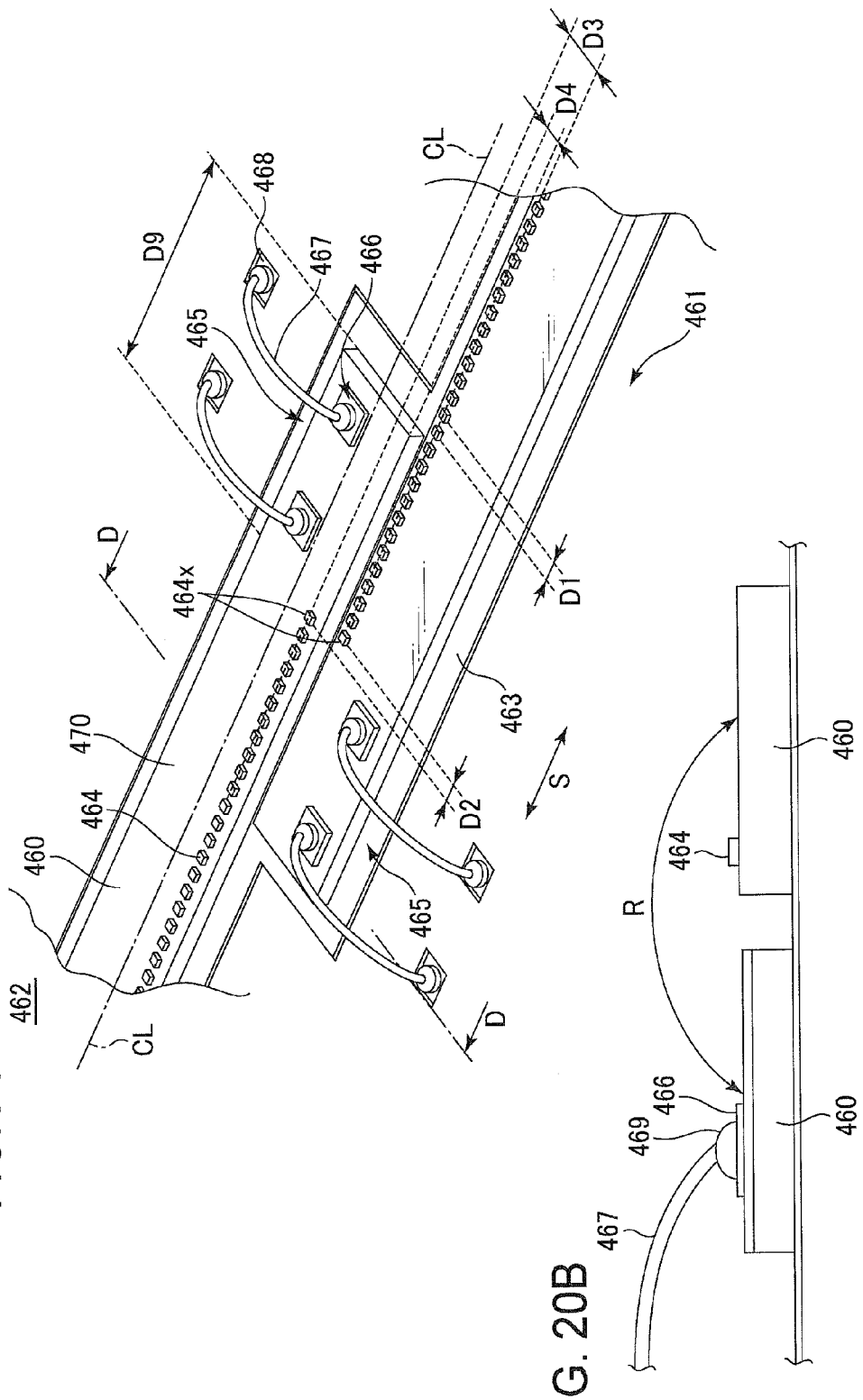

SEMICONDUCTOR APPARATUS, EXPOSING HEAD, AND IMAGE FORMING APPARATUS

BACKGROUND OF THE INVENTION

1. Field of the Invention

The present invention relates to a semiconductor apparatus, an exposing apparatus, and an image forming apparatus, and may be advantageously applied to a print head in which a plurality of light emitting element array chips are aligned on a circuit board.

2. Description of the Related Art

A conventional light emitting diode (LED) print head, which is used in an LED printer, employs a configuration in which a plurality of semiconductor light emitting element array chips are mounted on a print wiring board and are aligned in a straight line. Each array chip has a plurality of light emitting portions formed in its surface, the light emitting portions being aligned in one dimension at predetermined intervals.

This type of LED print head is assembled by first applying an adhesive to a print wiring board, and then semiconductor light emitting element array chips are pressed on the adhesive against the print wiring board, and finally allowing the adhesive to cure. In this manner, the semiconductor light emitting element array chips secured on the print wiring board.

If the space between adjacent chips is too narrow, the adhesive is drawn into the space by capillary action up to the same level as the surface of the array chips, soiling the light emitting portions and causing usable light power to decrease. The adhesive may also contaminate the wire bonding pads formed on the end portion of the surface of the array chips, reducing the mechanical strength of the wire bonded portions.

Japanese Patent Laid-Open No. 2011-131475 discloses a print head in which the adhesive is applied only to a limited surface area on the print wiring board, e.g., a middle portion of the back surface of the array chip, thereby preventing the adhesive from being drawn into the space between adjacent array chips up to the upper surface of the array chips.

However, applying the adhesive only to a middle portion of the back surface of the array chip causes end portions of the back surface to be uplifted, so that edges of the array chip may be chipped during wire bonding or the array chip may be inclined at an angle with respect to the surface of the print wiring board.

If end portions of the back surface of the array chip are uplifted from the print wiring board, heat dissipation is more difficult at the end portions than in the middle portion of the back surface, so that the temperature of the end portions is higher than the middle portion.

Although applying the adhesive only to a limited portion of the back surface is effective in preventing the adhesive from contaminating the chip surface, but may increase the chances of the chips inclining and being damaged, impairing the reliability of the LED print head.

SUMMARY OF THE INVENTION

The present invention was made to solve the aforementioned drawbacks.

An object of the present invention is to provide a semiconductor apparatus in which semiconductor array chips are protected against contamination by an adhesive, an exposing head that employs the semiconductor apparatus, and an image forming apparatus that employs the exposing head.

A semiconductor apparatus includes a rectangular plate-like body including a major surface. A plurality of light emitting portions is formed in the major surface, and aligned in a straight line. A first terraced portion and a second terraced portion are formed in the major surface except areas in which the plurality of light emitting portions are formed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and wherein:

FIG. 2A is a perspective view of an LED print head in its entirety;

FIG. 2B is a perspective cross-sectional view taken along a line A-A in FIG. 2A;

FIG. 3A illustrates the appearance of a chip-on-board module (COB);

FIG. 3B is a partial expanded view of a pertinent portion of the COB shown in FIG. 3A;

FIG. 5A is a perspective view of a comparison COB in which semiconductor light emitting element array chips with no terraced portion are mounted on a print wiring board;

FIG. 5B is an expanded view of a portion P shown in FIG. 5A;

FIG. 12A is a partial perspective view of the COB according to a second embodiment;

FIG. 12B is an expanded view of a relevant portion P of the COB shown in FIG. 12A;

FIG. 19A is a partial perspective view of a COB according to the third embodiment;

FIG. 19B is a cross-sectional view taken along a line C-C in FIG. 19A;

FIG. 20A is a perspective view of the comparison COB on which semiconductor light emitting element array chips are mounted;

FIG. 20B is a cross-sectional view taken along a line D-D in FIG. 20A; and

DETAILED DESCRIPTION OF THE INVENTION

The present invention will be described in detail by way of preferred embodiments with reference to the accompanying drawings.

First Embodiment

Overall Configuration of LED Printer

Figure 1:
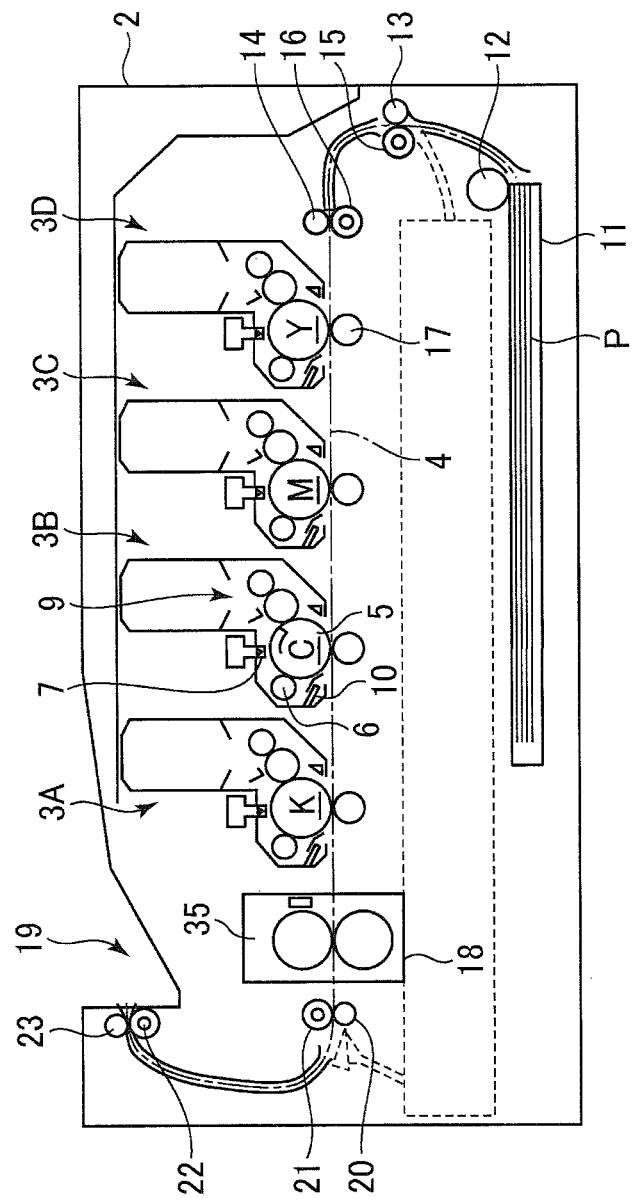
FIG. 1 illustrates the outline of an LED printer according to the present invention.

FIG. 1 illustrates the outline of an LED printer 1 according to the present invention. The LED printer 1 includes a generally box-shaped chassis 2.

The chassis 2 accommodates four process units 3A, 3B, 3C, and 3D for forming yellow (Y), magenta (M), cyan (C), and black (K) images, respectively, by electrophotography. The four process units 3A, 3B, 3C, and 3D are aligned along a transport path 4 of a recording medium P.

Each of the process units 3A, 3B, 3C, and 3D includes a photoconductive drum 5 as an image bearing body, a charging unit 6, an exposing unit 7, a developing unit 9, and a cleaning unit 10, which are disposed to surround the photoconductive drum 5. The charging unit 6 uniformly charges the surface of the photoconductive drum 5. The exposing unit 7 selectively illuminates the charged surface of the photoconductive drum 5 to form an electrostatic latent image on the photoconductive drum 5. The developing unit 9 supplies toner to the electrostatic latent image to develop the electrostatic latent image into a toner image. The cleaning unit 10 removes the residual toner from the photoconductive drum 5 after transferring the toner image onto the recording medium P. The photoconductive drum 5 is driven by a drive source through a train of gears (not shown), and rotates in a clockwise direction in FIG. 1.

The chassis 2 accommodates a paper cassette 11, which holds a stack of sheets of the recording medium P. A hopping roller 12 feeds the recording medium P into the transport path 4 on a sheet-by-sheet basis from the paper cassette 11. Pinch rollers 13 and 14 and registration rollers 15 and 16 are disposed between the hopping roller 12 and the process unit 3D. The registration rollers 15 and 16 cooperate with the pinch rollers 13 and 14, respectively, to hold the sheet of the recording medium P in a sandwiched relation. The registration rollers 15 and 16 cooperate to remove skew of the recording medium P. The hopping roller 12 and registration rollers 15 and 16 are driven in rotation in an interlocking manner by a drive source (not shown).

A transfer roller 17 is disposed to face a corresponding photoconductive drum 5 with the transport path 4 sandwiched between the photoconductive drum 5 and the transfer roller 17. The transfer roller 17 is formed of, for example, a semi-conductive rubber material. The potentials of the photoconductive drum 5 and the transfer roller 17 are selected so that the toner image formed on the photoconductive drum 5 can be reliably transferred onto the recording medium P.

A fixing unit 18 is located downstream of the process unit 3A with respect to the transport path 4. A pair of discharge rollers 20 and 21 and a pair of discharge rollers 22 and 23 are disposed downstream of the fixing unit 18, and discharge the recording medium P onto a stacker 19 formed on the upper surface of the chassis 2.

The sheet of the recording medium P is fed by the hopping roller 12 into the transport path 4, and is further transported by the pinch rollers 13 and 14 and the registration rollers 15 and 16. The sheet of the recording medium P then passes through the four process units 3A, 3B, 3C, and 3D, in that stated order. While the recording medium P passes through the process units 3A, 3B, 3C, and 3D, the toner images of the respective colors are transferred onto the recording medium P one over the other in registration. The recording medium P is then fed into the fixing unit 18 where the toner images of the respective colors on the recording medium P are fixed under heat and pressure. After fixing, the recording medium P is discharged onto the stacker 19 by the discharging rollers 20 to 23.

{Configuration of LED Print Head}

A description will be given of the configuration of an LED head 8 mounted on the exposing unit 7 of each of the process units 3A, 3B, 3C, and 3D. FIG. 2A is a perspective view of the LED print head 8 in its entirety and a perspective cross-sectional view. FIG. 2B is a cross-sectional view taken along a line A-A in FIG. 2A. The LED print head 8 extends in a longitudinal direction thereof and includes a frame 30 having a generally U-shaped cross-section. The frame 30 is made of, for example, an aluminum block, a metal plate, or a resin (e.g., liquid crystal polymer).

The frame has a longitudinal opening 31 that extends in the longitudinal direction. A chip-on-board (COB) module 133 fits into the opening 31. A narrow opening 32 is formed in the bottom of the U-shaped frame 30, and extends in the longitudinal direction of the frame 30. The COB 133 includes a rectangular wiring board 134. A plurality of array chips 135 of semiconductor light emitting portions are aligned in a straight line on the print wiring board 134. The COB 1133 is attached to the frame 30 such that the plurality of array chips 135 face the opening 32. As shown in FIG. 2A, the LED print head 8 extends in the longitudinal direction thereof shown by arrow S, which is parallel to a main scanning direction of the printer 1 perpendicular to a direction in which the recording medium P is transported.

A rod lens array 36 generally in the shape of a rectangular parallelepiped fits into the opening 32. The rod lens array 36 forms an erect image of unity magnification of the light emitted from the array chips 135 on the charged surface of the photoconductive drum 5. One of the lens surfaces, 36b, of the rod lens array 36 is a distance L from the light emitting surface of the array chips and the other of the lens surfaces extends outwardly through the opening 32, so that the image of the light emitting portions is formed on the surface of the photoconductive drum 5, which is a distance L from the other lens surface of the rod lens array, 36a.

Each LED print head 8 is assembled to a corresponding exposing unit 7 so that the lens surface projecting outwardly from the frame 30 faces the surface of the corresponding photoconductive drum 5.

Figure 4A:
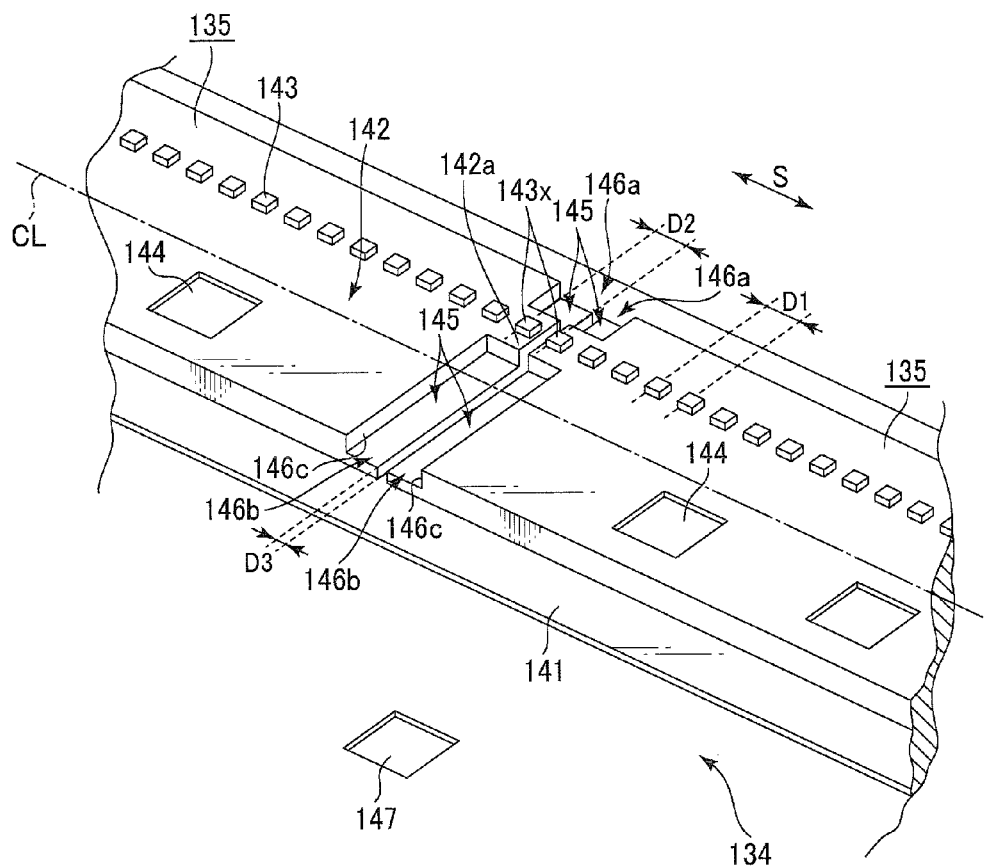
FIG. 4A is a further expanded perspective view of the portion P shown in FIG. 3B.
Figure 4B:
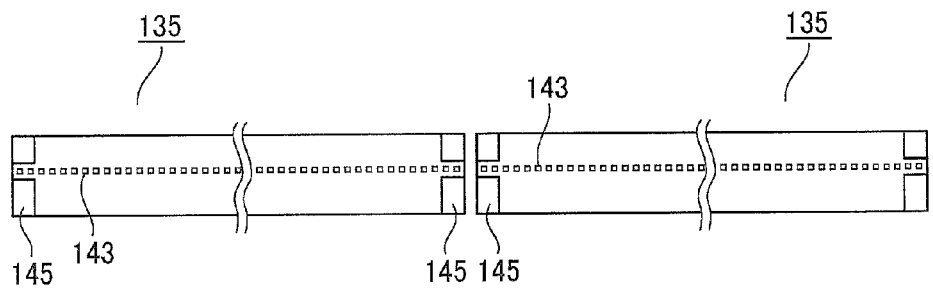
FIG. 4B illustrates the positional relationship among two consecutive odd-numbered array chips and an even numbered array chip between the two consecutive odd-numbered array chips.

A further description will be given of the print wiring board 134 and the array chips 135 mounted on the print wiring board 134. FIG. 3A illustrates the appearance of the chip-on-board module 133. FIG. 3B is a partial expanded view of a portion P of the chip-on-board (COB) 133 shown in FIG. 3A. FIG. 4A is a further perspective expanded view of a pertinent portion. FIG. 4B illustrates the positional relationship among two consecutive odd-numbered array chips and an even numbered array chip between the two consecutive odd-numbered array chips. For simplicity's sake, FIG. 4A does not show Au wires 140 (FIG. 3B), which connect between the print wiring board 134 and the array chips 135.

Referring to FIGS. 3A, 3B, 4A, and 4B, a plurality of rectangular plate-like array chips 135 are mounted on the surface of the print wiring board 134 using an electrically conductive or an electrically non-conducive adhesive 141, the array chips 135 being aligned in the main scanning direction shown by arrow S so that the first short side of an even-numbered semiconductor apparatus directly faces the second short side of an odd numbered semiconductor apparatus and the light emitting portions of adjacent array chips are in a single straight line (FIG. 4B). Light emitting portions 143, which are light emitting diodes, are formed in the top surface 142 of each array chip 135. The light emitting portions 143 are formed of a GaAs compound semiconductor, and are aligned in a one dimension at intervals of 42.3 μm resolution of 600 dpi) or at intervals of 21.2 μm (i.e., a resolution of 1200 dpi). Each light emitting portion 143 may be implemented as a light emitting diode (LED) by achieving a PN junction of a P-type semiconductor and an N type semiconductor. Alternatively, the light emitting portions 143 may be Thyristors that take the form of a PNPN junction or an NPNP junction.

The array chip 135 is rectangular, and has a longitudinal center line CL, long sides, and short sides. A straight line of the light emitting portions 143 extends in a direction parallel to the long sides, and is closer to one of the long sides of the array chip 135 than the longitudinal center line CL (FIG. 4A), while a straight line of the wire bonding pads 144 extends in a direction parallel to the long sides, and is closer to the other of the long sides than the longitudinal center line CL (FIG. 4A). The wire bonding pads 144 are aligned at predetermined intervals.

Just as in the light emitting portions 143, the array chips 135 may be fabricated from a GaAs substrate. In addition to the light emitting portions 143, the array chip 135 may have shift registers (not shown) that sequentially shifts a signal received from an external drive circuit. Alternatively, the array chips 135 may also be fabricated from an Si substrate on which IC driver circuits are fabricated for driving the light emitting portions 143. In other words, thin films of light emitting layer with a thickness of less than 5 μm are grown on a GaAs substrate formed of a compound semiconductor, and are integrated on an IC driver circuit substrate using intermolecular force, and then the light emitting portions 143 are fabricated using thin film wiring that can be formed using photolithography and metal thin-film forming technology, and the driver circuits and light emitting portions 143 are integrated on the GaAs substrate through electrical interconnection. The thickness of the array chips 135 can be selected to be in the range of, for example, from 200 μm to 600 μm.

Referring to FIG. 4A, the array chip 135 has stepped portions or terraced portions 146 at each of the longitudinal end portions of the array chip 135. At the terraced portion 146, the array chip 135 has a transition or wall 146c from the top surface 142 to a recessed surface 145 that is recessed from the top surface 142 and is substantially parallel to the top surface. In other words, the recessed surface is lower than the top surface by a predetermined distance.

More specifically, the top surface 142 includes a small terraced portion 146a and a large terraced portion 146b formed at each longitudinal end portion of the array chip 135, the small and large terraced portions 146a and 146b defining a peninsula-shaped portion 142a in which an endmost light emitting portion 143x is formed. The peninsula-shaped portion 142a extends to the longitudinal end of the array chip 135. The recessed surface 145 is lower than the top surface 142 by 20 μm to 200 μm depending on the thickness of the array chip, and extends at least 20 μm in the longitudinal direction of the array chip 135 from the longitudinal end of the array chip.

If the array chip 135 is formed on a GaAs substrate, the terraced portions 146a and 146b may be formed as follows: A wafer is diced into individual rectangular array chips 135. A photoresist material is applied to areas of the array chip 135 except for an area in which the terraced portion 146 is to be formed. The passivation film or interlayer dielectric film is removed by CF4 dry etching from the area in which the terraced portion 146 is to be formed, so that the GaAs substrate is exposed. The exposed GaAs substrate is subjected to wet etching using an etchant which is a mixed solution of sulfuric acid, hydrogen peroxide water, and water. The array chip 135 is etched to a depth of 20 μm to 200 μm. The photoresist material is then removed from the array chip 135, thereby forming the terraced portions 146a and 146b in the array chip 135.

If the array chip 135 takes the form of an Si IC driver circuit substrate, the terraced portions 146a and 146b may be formed as follows: The driver circuit is designed such that no circuit occupies an area in which the terraced portions 146a and 146b are to be formed. Just as in the GaAs substrate, a photoresist material is applied to areas of the array chip except for the areas in which the terraced portions 146a and 146b are to be formed. The passivation film or interlayer dielectric film in the areas in which the portions 146a and 146b are to be formed is removed by CF4 dry etching, so that the Si substrate is exposed. The exposed Si substrate is subjected to chemical dry etching that uses a gas, for example, SF6, thereby etching the array chip to a depth of 20 µm to 200 µm. The photoresist material is then removed from the array chip 135, thereby forming the terraced portions 146a and 146b in the array chip 135.

Using an adhesive 141, the array chips having the terraced portion 146 formed therein are mounted on the wiring board 134 formed of, for example, composite epoxy material (CEM3) or flame retardant 4 (FR4), being aligned in the longitudinal direction of the array chip 135. The center-to-center distance D2 between the respective endmost light emitting portions of adjacent array chips is equal to the center-to-center distance D1 between adjacent light emitting portions 143 on the array chip 135. When the light emitting portions 143 are arranged at intervals of about 42.3 µm (equivalent to 600 dpi), the distance between adjacent array chips 135 is selected to be about 10 µm, which is shorter than the distance D1, and when the light emitting portions are arranged at intervals of about 42.3 µm (equivalent to 1200 dpi), the distance between adjacent array chips 135 is selected to be about 5 µm, which is shorter than the distance D1.

The adhesive 141 may be transferred onto the print wiring board 134 using the stamp function of a die bonder (not shown). Alternatively, a dispenser (not shown) is used to form a layer of the adhesive 141 on predetermined areas on the print wiring board 134. The layer of the adhesive 141 is formed so that the entire back surface of the array chip 135 can be in contact with the layer of the adhesive 141. In this manner, the array chip 135 is pressed against the layer of the adhesive 141. The adhesive 141 then cures, thereby fixedly bonding the entire back surface of the array chip 135 to the print wiring board 134.

As described above, the array chip 135 carries wire bonding pads 144 through which data can be inputted from and outputted to an external driver circuit, and the print wiring board 134 carries wire bonding pads 147 through which data can be inputted from and outputted to the array chip 135. A bonding wire connects a wire bonding pad 147 to a corresponding wire bonding pad 144. A line of wire bonding pads 144 and a line of wire bonding pads 147 extend in directions substantially parallel to the longitudinal direction or the center line CL of the array chip 135, and are spaced apart by a predetermined distance.

Referring to FIG. 3B, the wire bonding pads 144 and the wire bonding pads 147 are electrically connected by means of Au wires 140. A ROM, chip capacitors, connectors through which the data is communicated between the LED printer 1 and the LED print head 8 are mounted on the print wiring board 134, thereby configuring the COB 133 for the LED print head 8. This COB 133 is assembled to the frame 30 of the LED print head 8.

Effects of First Embodiment

Effects of forming the terraced portions 146 in the array chip 135 will be described. The effects will be described by comparing the COB 133 according to the first embodiment with a comparison COB 152 whose array chips 150 have no terraced portions.

FIG. 5A is a perspective view of the comparison COB 152 in which semiconductor light emitting element array chips 150 with no terraced portions 146 are mounted on a print wiring board 151. FIG. 5B is an expanded view of a portion P shown in FIG. 5A. The comparison COB 152 has the same configuration as the COB 133 except that the array chips 50 have not the terraced portions 146 formed therein.

The comparison COB 152 includes a plurality of array chips 150 bonded to the print wiring board 151 using an adhesive 153 and aligned in a straight line. The adjacent array chips 150 are disposed so that the lines of the light emitting portions of the adjacent array chips 150 are in line with each other and the distance D2 between the respective endmost light emitting portions 154x of the adjacent array chips 152 is equal to the distance D1 between adjacent light emitting portions 154 in the array chips 150. When the light emitting portions 154 are disposed at intervals of about 42.3 µm (equivalent to 600 dpi), the distance between adjacent array chips 150 is selected to be about 10 µm or less, and when the light emitting portions 154x are disposed at intervals of about 42.3 µm (equivalent to 1200 dpi), the distance between adjacent array chips 150 is selected to be about 5 µm.

The array chip 150 has wire bonding pads 155 formed thereon and the print wiring board 151 has wire bonding pads 156 formed thereon. Au wires 157 connect between the wire bonding pads 155 and corresponding wire bonding pads 156.

Figure 6:
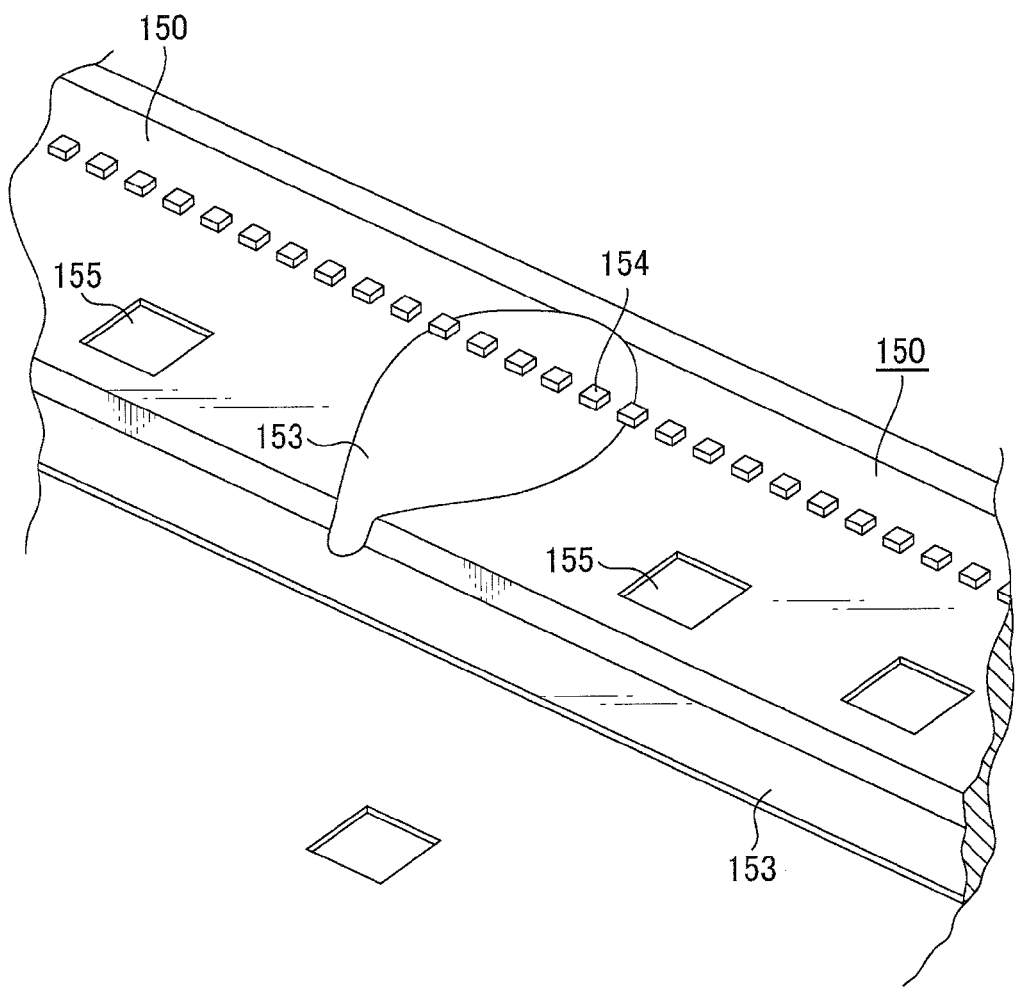
FIG. 6 illustrates how an adhesive climbs up the gap between adjacent array chips and flows on the surface of the adjacent array chips of the comparison COB shown in FIG. 5B.

FIG. 6 illustrates how the adhesive climbs up and flows on the surface of the adjacent array chips of the comparison COB 152. The adhesive 153 is drawn into the space between the adjacent array chips 150 by capillary action up to the same level as the surface of the array chips 150, soiling the light emitting portions 154 and causing usable light power to decrease. The adhesive 153 may also contaminate the wire bonding pads 155 formed on the end portion of the surface of the array chips 150, reducing the mechanical strength of the wire bonding.

Figure 7:
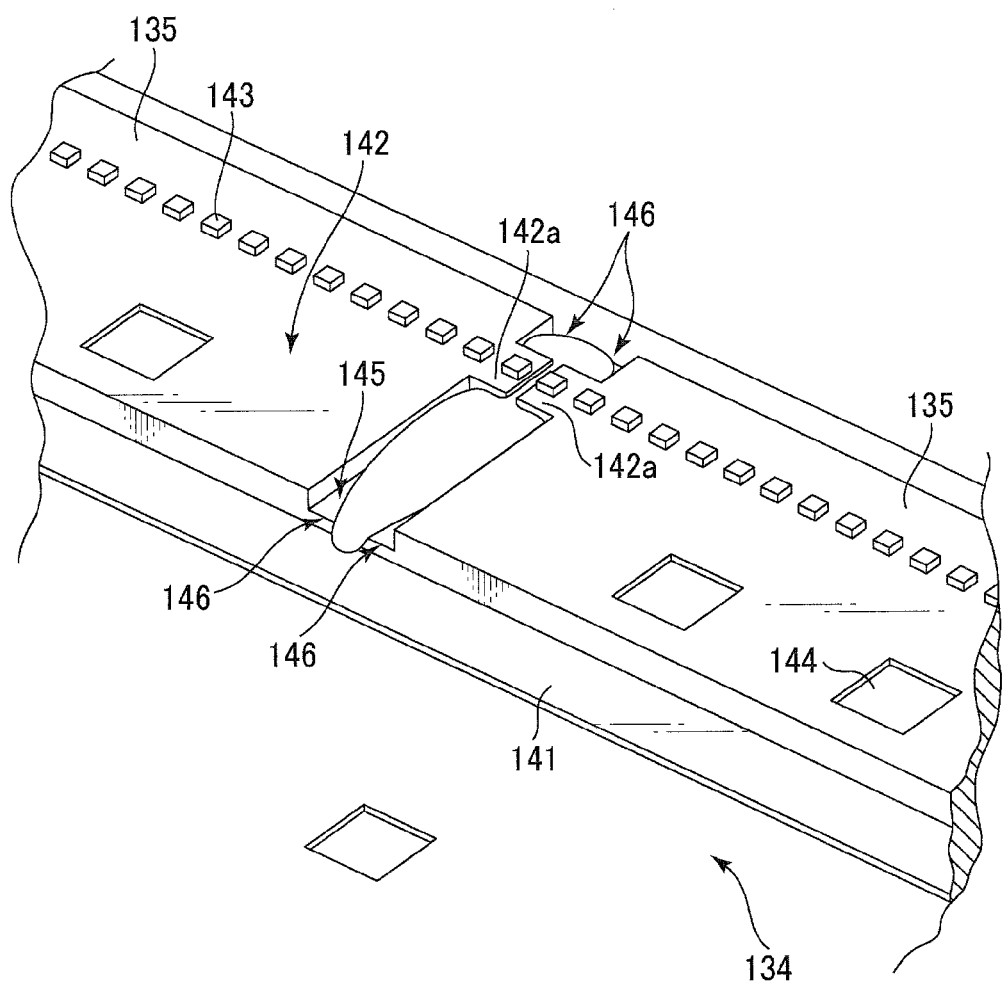
FIG. 7 illustrates how the adhesive climbs up the gap between the adjacent array chips and flows on the surface of the adjacent array chips of the COB according to the first embodiment.

FIG. 7 illustrates how the adhesive climbs up and flows on the surface of the adjacent array chips 135 of the COB 133 according to the first embodiment. While the adjacent array chips 135 on the COB 133 are aligned at the same intervals as the array chips 150 on the comparison COB, and the entire back surface of the array chips 135 are in contact with the layer of the adhesive 141, the recessed surface 145 lower than the top surface 142 bypasses the adhesive 141 that would otherwise climb up the gap between the adjacent array chips to the top surface 142.

The COB 133 according to the first embodiment does not place any limitation on the area on the back surface of the array chip 135 in which the adhesive 141 may be applied. In other words, the adhesive 141 can be applied to the entire back surface of the array chip 135 so that the array chip 135 can be bonded in its entire back surface to the print wiring board 134. This prevents the end portions of the back surface of the array chip 135 from being uplifted, thereby reducing the chances of the array chip 135 inclining and the chip's end portions being damaged.

Since the entire back surface of the array chip 135 is bonded to the print wiring board 134 using the adhesive 141, the heat generated by the array chip 135 can be evenly conducted to the COB 133. In other words, heat dissipation can be uniform across the entire array chip 135.

Figure 8:
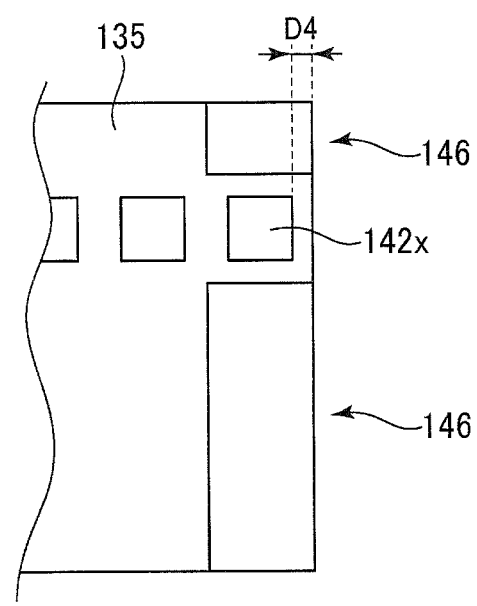
FIG. 8 is a partial top view of the array chip, illustrating the distance between an endmost light emitting portion and a longitudinal end of the array chip.

FIG. 8 is a partial top view of the array chip 135, illustrating the distance between the endmost light emitting portion 142x and the longitudinal end of the array chip 135. The terraced portion 146 of the COB 133 according to the first embodiment effectively receives or bypasses the adhesive 141, which climbs up the narrow gap between the adjacent array chips 135, even if the COB 133 employs a shorter distance D3 between adjacent array chips 135 than the comparison COB 152. Thus, employing the shorter distance D3 in the first embodiment provides a longer distance D4 (FIG. 8) between the endmost light emitting portion 143x and the end of the array chip 135 shown in FIG. 8 as compared to the comparison COB 152. The longer distance D4 increases mechanical strength of the array chip 135, reducing the chances of the edge portions of the array chip 135 being chipped.

As described above, the COB 133 has a configuration in which the array chips 135 are mounted in a straight line on the print wiring board 134 using the adhesive 141 and the entire back surface of the array chips 135 may be bonded to the print wiring board 134. In addition, the terraced portion 146 of the COB 133 bypasses the adhesive 141 which would otherwise climb up the narrow gap, thereby preventing the adhesive 141 from climbing onto the top surface of the array chips 135.

As described above, without sacrificing the reliability, the COB 133 effectively prevents the array chips 135 from being damaged, being inclined, increasing in temperature, and being contaminated by the adhesive 141.

Modification to First Embodiment

Figure 9:
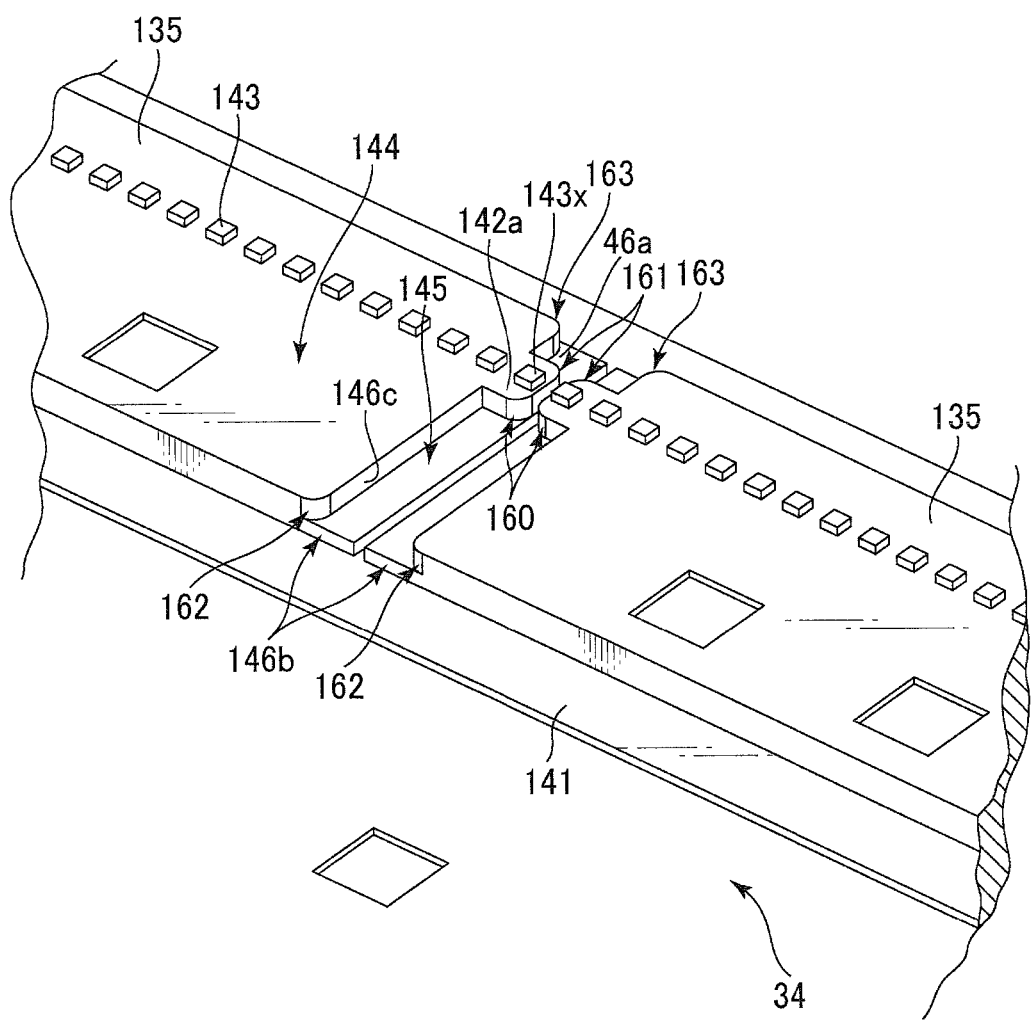
FIG. 9 illustrates a modification of the first embodiment.

FIG. 9 illustrates a modification of the first embodiment. The modification differs from the first embodiment in that the terraced portions have arrises or rounded portions 160, 161, 62, and 163.

Specifically, the wall 146c, which connects the top surface 142 and the recessed surface 145 of the terraced portions 146a and 146b, has rounded arrises or rounded portions 161 that surround the peninsula-shaped portion 142a. Due to the rounded portions 162 and 163, the surfaces 145 of the small and large terraced portions 146a and 146b are wider nearer the long sides of the array chip 135.

The rounded portions 160 and 161 are effective in widening the gap between the peninsula portions 142a of the adjacent array chips 135, reducing the chances of the adhesive 141 climbing up in the gap as well as guiding the adhesive 141 to the surfaces 145.

Figure 10:
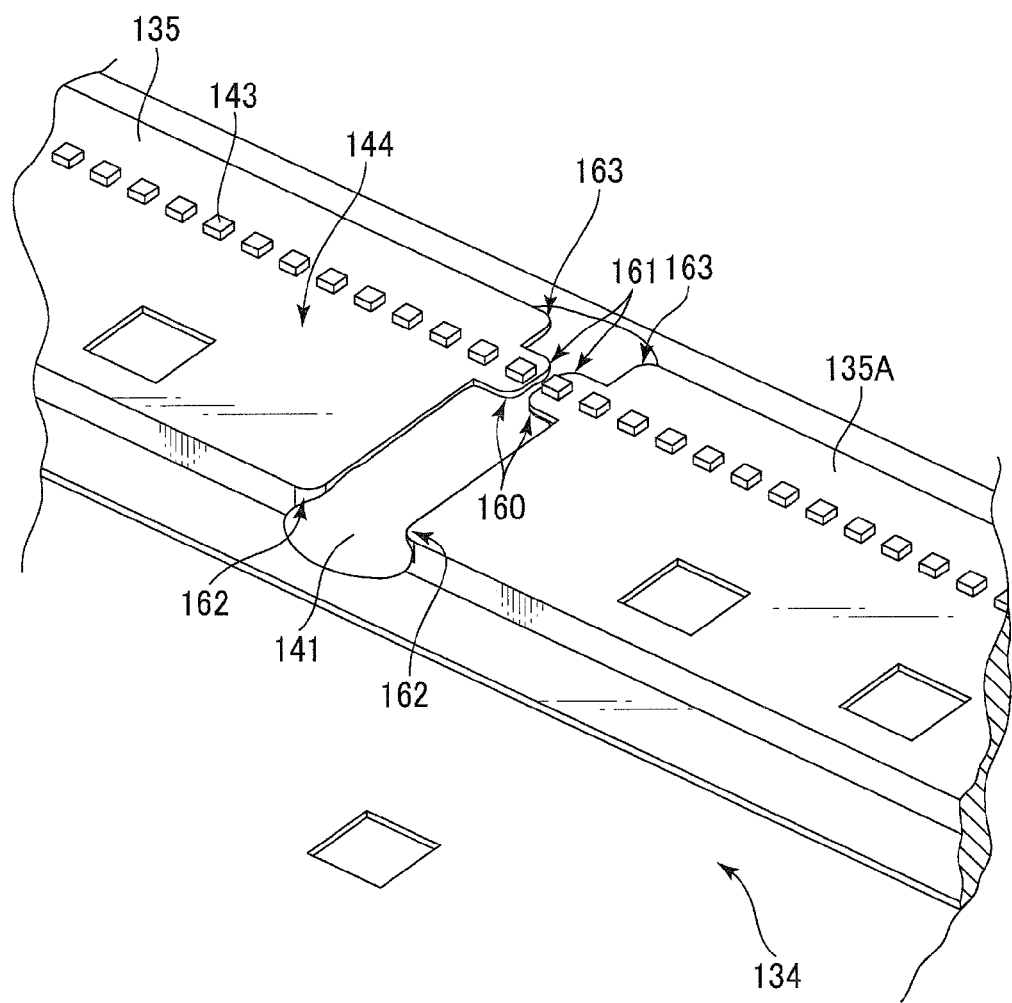
FIG. 10 illustrates how the adhesive flows on modified array chips.

FIG. 10 illustrates how the adhesive flows on the array chips on modified array chips. The array chips 135A are disposed on the print wiring board 134 so that one of the small and large terraced portions 146a and 146b of the adjacent array chips 135A is a mirror image of the other. Some of the adhesive 141 climbs up the gap to the surfaces 145, and then flows away from the peninsula portions 142a to the surface of the print wiring board 134, which is lower than the surfaces 145.

The two rounded portions 162 and 163 of the wall 146c effectively widen the path in which the adhesive 141 flows to the print wiring board 134, prompting the excess adhesive 141 to quickly flow out of the terraced portions 146. Other corners of the walls 146c may also be rounded as required.

In the first embodiment, the small and large terraced portions 146a and 146b are disposed on both sides of the peninsula-shaped portion 142a. The present invention is not limited to this. The array chip 135 may have only the large terraced portion 146b rather than the small and large terraced portions 146a and 146b.

Figure 11A:
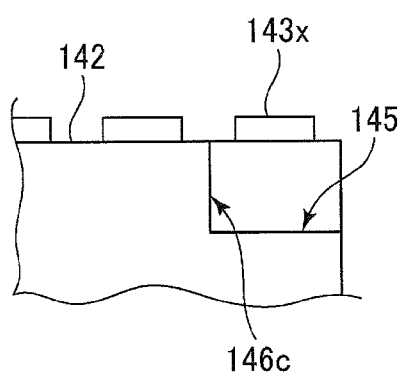
FIGS. 11A and 11B illustrate a wall that connects the top surface of the array chip and a recessed surface of the terraced portion.
Figure 11B:
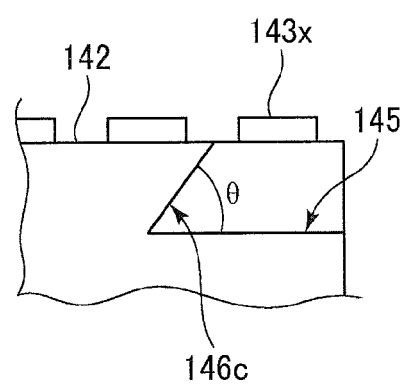

FIGS. 11A and 11B illustrate a wall 146c that connects the top surface 142 and the recessed surface 145. The wall 146c may be perpendicular to the top surface 142 and the recessed surface 145 as shown in FIG. 11A. Alternatively, the array chip 135 may be undercut such that the wall 65b extends obliquely over the recessed surface 145 to form an acute angle θ with the recessed surface 145 as shown in FIG. 11B. In other words, the wall 65b makes an acute angle with the recessed surface 145. The wall 146c is more effective in preventing the adhesive 141 from climbing up the gap between the adjacent array chips 135.

Second Embodiment

Configuration of COB

A second embodiment differs from the first embodiment in the configuration of semiconductor light emitting element array chip. The second embodiment will be described mainly in terms of chip-on-board (COB).

Figure 13A:
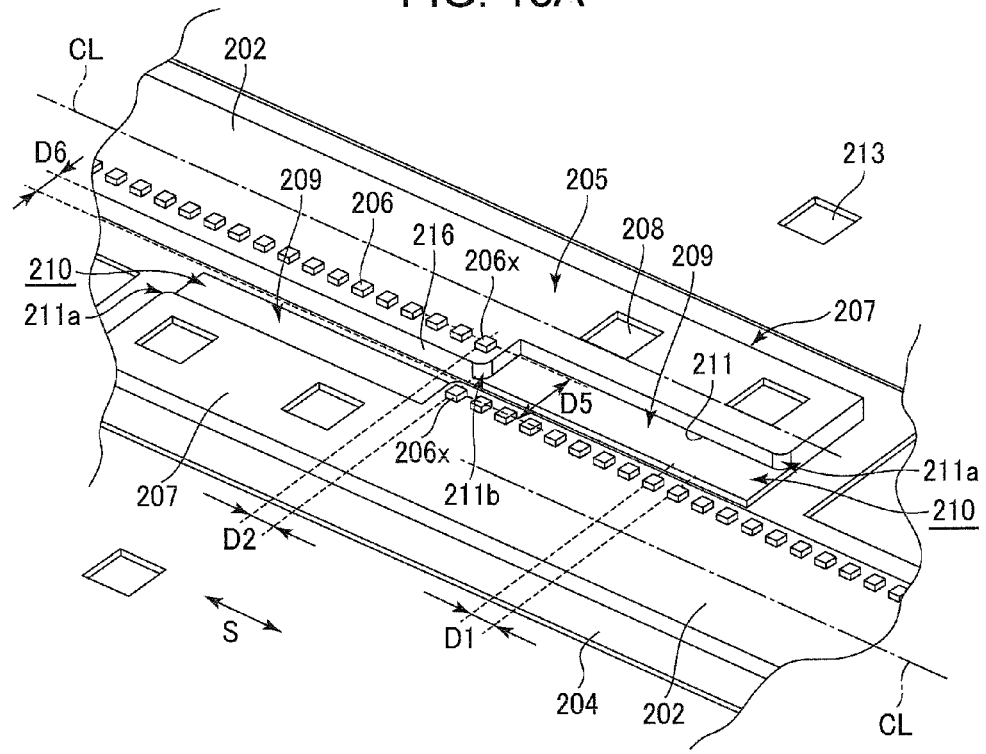
FIG. 13A is another expanded view of the relevant part of the COB shown in FIG. 12B.
Figure 13B:
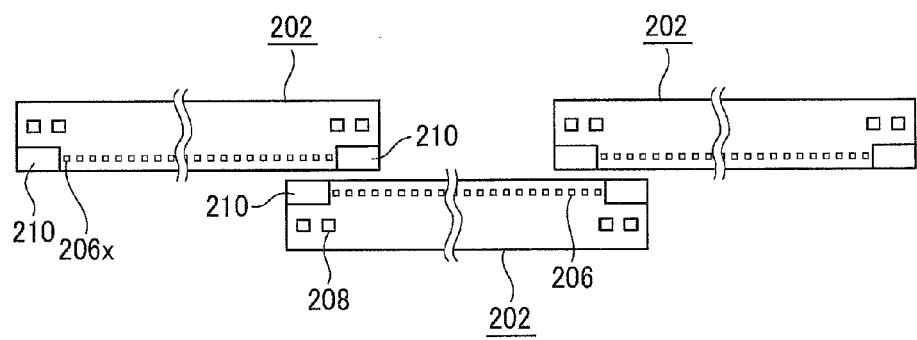
FIG. 13B illustrates the positional relationship among two consecutive odd-numbered array chips and an even numbered array chip between the two consecutive odd-numbered array chips.

FIGS. 12A, 12B and 13A illustrate the appearance of a COB 200 according to a second embodiment. FIG. 12A is a partial perspective view of the COB 200. FIG. 12B is an expanded view of a relevant portion P of the COB 200. FIG. 13A is another expanded view of the relevant part of the COB 200. FIG. 13B illustrates the positional relationship among two consecutive odd-numbered array chips and an even numbered array chip between the two consecutive odd-numbered array chips. For simplicity's sake, Au wires 203, which connect between a print wiring board 201 and semiconductor light emitting element array chips 202, are omitted from FIG. 13A.

A plurality rectangular plate-shaped array chips 202 of light emitting portions are aligned in a main scanning direction S of an LED printer 1 so that a line of even-numbered array chips 202 extends parallel to a line of odd-numbered array chips 202, the even-numbered array chips 202 are staggered with respect to the odd-numbered array chips 202, and long sides of adjacent array chips face each other in an overlapped relation.

Just as in the first embodiment, each array chip 202 can be fabricated on a GaAs substrate or an IC driver circuit substrate. The array chip 202 has a thickness of, for example, 200 μm to 600 μm. A straight line of a plurality of light emitting portions 206 is fabricated in the top surface 205 of the array chip 202 at intervals D1 of about 42.3 μm (600 dpi) or about 21.2 μm (1200 dpi). The light emitting portions 206 are formed mainly of, for example, a GaAs compound semiconductor material.

The light emitting portions 206 are located closer to one of the long sides than a longitudinal center line CL (FIG. 13) and wire bonding pads 208 are arranged closer to the other of the long sides than the longitudinal center line CL. Adjacent array chips 202 are arranged so that the lines of even-numbered and odd numbered light emitting portions 206 are parallel to each other and the endmost light emitting portions 206x in the two lines are spaced apart by the distance D2. Each array chip 202 includes stepped portions or terraced portions 210 (FIG. 13) at each of the longitudinal end portions of the array chip 202, the terraced portions 110 defining a peninsula-shaped portion 207 (FIG. 13) in which no light emitting portion 206 is formed. The terraced portion 210 extends in the line of the light emitting portions 206 further than the endmost light emitting portion 106x to the longitudinal end of the array chip 202. The terraced portion 210 has a transition or an L-shaped wall 211 that connects the top surface 205 and a recessed surface 209, which is recessed from the top surface 205 and is substantially parallel to the top surface 205. In other words, the recessed surface 209 is lower than the top surface 205 by a predetermined distance. The recessed surface 209 is lower than the top surface 205 by, for example, 20 μm to 200 μm, and extends over 20 μm or longer in a direction substantially perpendicular to the longitudinal center line CL. The terraced portion 210 and the peninsula-shaped portion 207 are aligned side by side in a direction perpendicular to the longitudinal center line CL. The peninsula-shaped portion 207 extends a distance of 100 µm to 500 µm from the top surface 205 to the end of the array chip 102. The peninsula-shaped portion 207 has a plurality of wire bonding pads 108 formed therein and aligned in a direction parallel to the longitudinal center line CL with an interval of a predetermined distance. Since the wire bonding pads 208 are formed in the peninsula-shaped portion 214, thereby providing more efficient utilization of space so that a larger number of array chips 202 can be diced from a single wafer.

If the array chip 202 is formed on a GaAs substrate, the terraced portion 210 may be formed as follows: A wafer is diced into individual rectangular array chips 202. A photoresist material is applied to areas of the array chip 202 except for an area in which the terraced portion 210 is to be formed. The passivation film or interlayer dielectric film in the area, which will be the terraced portion 210, is removed by, for example, CF4 dry etching, so that the GaAs substrate is exposed. The exposed GaAs substrate is subjected to chemical dry etching that uses, for example, chlorinated gas, or wet etching that uses an etchant which is a mixed solution of sulfuric acid, hydrogen peroxide water, and water. The array chip 202 is etched to a depth of 20 µm to 200 µm. The photoresist material is then removed from the array chip 202, thereby forming the terraced portion 210 in the array chip 202.

If the array chip 202 takes the form of an Si IC driver circuit substrate, the terraced portion 210 may be formed as follows: The driver circuit is designed such that no circuit occupies an area in which the terraced portion 210 is to be formed. Just as in the GaAs substrate, a photoresist material is applied to areas of the array chip 202 except for the area in which the terraced portion 210 is to be formed. The passivation film or interlayer dielectric film in the area, which will be the terraced portion 210, is removed by CF4 dry etching, so that the Si substrate is exposed. The exposed Si substrate is subjected to chemical dry etching that uses a gas, for example, SF6, thereby etching the array chip to a depth of 20 µm to 200 µm. The photoresist material is then removed from the array chip 202, thereby forming the terraced portion 210 in the array chip 202.

As shown in FIG. 13A, the wall 211, which connects the top surface 205 and the recessed surface 209 of the terraced portion 210, has rounded arrises or rounded portions 211a at the longitudinal end of the array chip 202 and rounded portions 211b near the endmost light emitting portion 206x such that the surface 205 is wider nearer the short side of the array chip 202 and is wider nearer the long side of the array chip 202.

Referring to FIG. 13B, the array chips 202 are aligned generally in two directions parallel to the center line CL of the array chips, so that even-numbered array chips 202 lie in one of two directions and odd-numbered array chips 202 lie in the other of the two directions. The even-numbered array chips 202 are staggered with respect to the odd-numbered array chips 202, so that the even-numbered array chips 202 and the odd-numbered array chips 202 are overlapped with each other. One of two parallel lines perpendicular to the center line CL passes through the center of the endmost light emitting portion 206x of one of the adjacent array chips 202, and the other of the two parallel lines passes through the center of the endmost light emitting portion 206x of the other of the adjacent array chips 202 such that the distance D2 between the two parallel lines is equal to a center-to-center distance D1 between adjacent light emitting portions 206 in each array chip 202.

It is preferable that the adjacent array chips 202 are mounted on the print wiring board 201 so that the distance D5 between the long side of one of the adjacent array chips 202 and the long side of the other of the adjacent array chips 202 is as short as possible. Since the array chips 202 mounted on the print wiring board 201 includes the even-numbered array chips 202 and the odd-numbered array chips, the even-numbered array chips 202 being staggered with respect to the odd-numbered array chips 202, if the distance D5 can be sufficiently short, the amount of light emitted from the even-numbered array chips 202 and incident on a rod lens 36 can be substantially equal to the amount of light emitted from the odd-numbered array chips 202 and incident on the rod lens 36.

The adhesive 204 is applied to a predetermined area of the print wiring board 201 so that the entire back surface of the array chip 202 may be in contact with the adhesive 204. The array chip 202 is pressed against the layer of the adhesive 204 formed on the print wiring board 201. The adhesive 204 is then cured, thereby securely bonding the array chip 202 to the print wiring board 201 across the entire back surface of the array chip 202.

As described above, the array chip 202 has wire bonding pads 208 formed therein for communicating data with external driver circuits. Likewise, wire bonding pads 213 are formed on the print wiring board 201 in correspondence with the wire bonding pads 208. Each wire bonding pad 208 and a corresponding wire bonding pad 213 are spaced apart by a predetermined distance.

An Au bonding wire 203 (FIG. 12B) connects each wire bonding pad 208 and a corresponding wire bonding pad 213. The print wiring board 201 has a ROM, chip capacitors, and connectors for communicating data with the LED printer 1, all being not shown, thereby completing the COB 200 for an LED print head 8. The COB 200 is assembled to a frame 30 of the LED print head 8 just as in the first embodiment.

Effects of Second Embodiment

A description will be given of the effects of forming the terraced portion 210 in the array chips 202 arranged in a staggered relation. The effects will be described by comparing the COB 200 according to the second embodiment with a comparison COB 222 whose array chips 202 have no terraced portions.

Figures 14A, 14B:
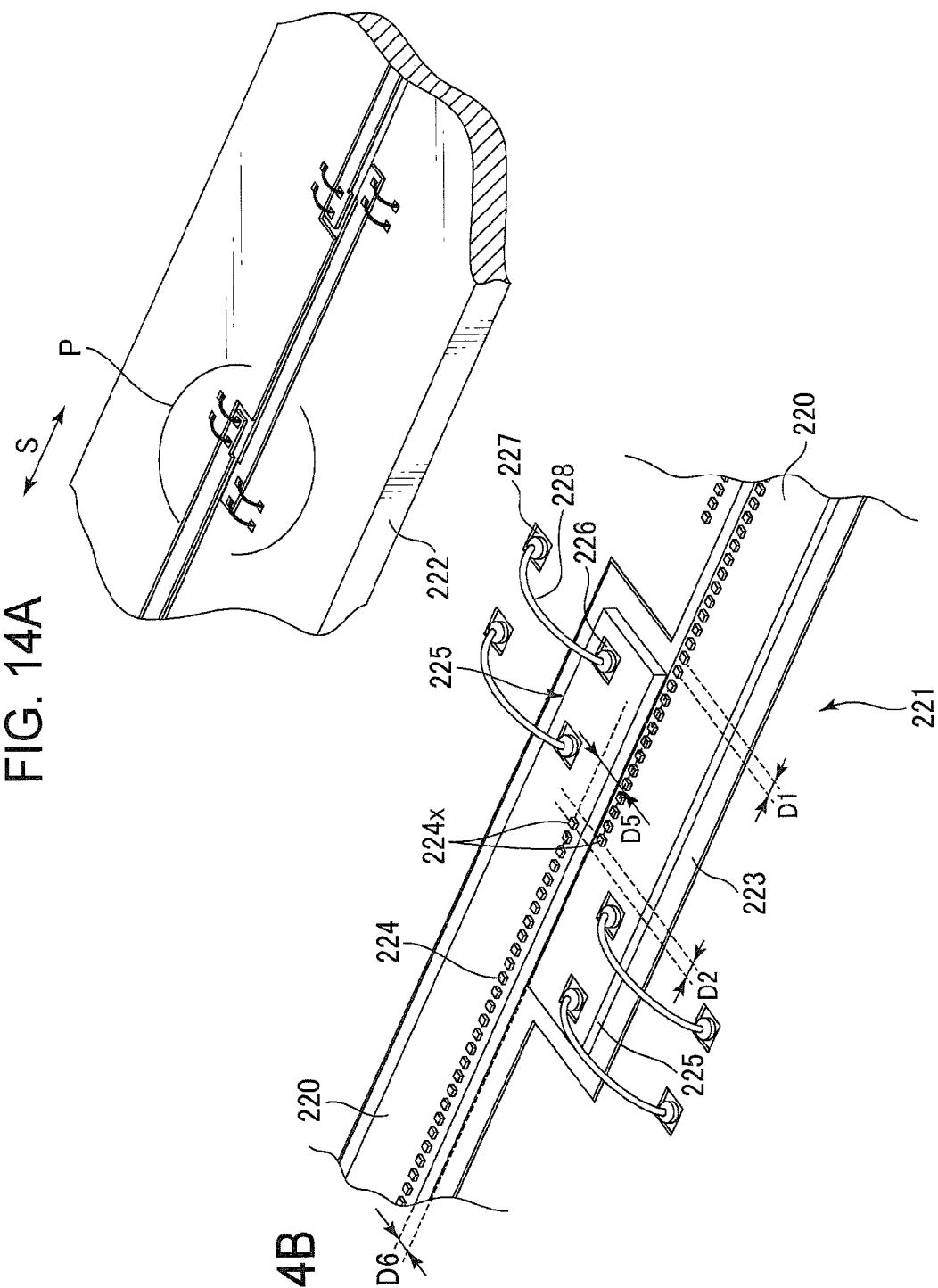
FIG. 14A illustrates the appearance of a comparison COB of the second embodiment.
FIG. 14B is an expanded view of a portion P shown in FIG. 14A.

FIG. 14A illustrates the comparison COB 222 in which light emitting element array chips 220 are mounted on a print wiring board 221. FIG. 14B is an expanded view of a portion P shown in FIG. 14A. The comparison COB 222 differs from the comparison COB 200 according to the second embodiment in that the array chips 220 have no terraced portions 210.

The comparison COB 222 includes a plurality of array chips 220 bonded to the print wiring board 221 using an adhesive 223 and aligned in such a way that even-numbered array chips 220 are staggered with respect to odd-numbered array chips 220. The array chips 220 are aligned generally in two directions parallel to the center line CL of the array chips 220, so that even-numbered array chips 220 lie in one of two directions and odd-numbered array chips 220 lie in the other of the two directions. The even-numbered array chips 220 are staggered with respect to the odd-numbered array chips 220, so that the even-numbered array chips 220 and the odd-numbered array chips 220 are overlapped with each other'. One of two parallel lines perpendicular to the center line CL passes through the center of the endmost light emitting portion 224x of one of the adjacent array chips 220, and the other of the two parallel lines passes through the center of the endmost light emitting portion 224x of the other of the adjacent array chips 202 such that the distance D2 between the two parallel lines is equal to a center-to-center distance D1 between adjacent light emitting portions 224 in each array chip 220. Thus, the array chips 220 are mounted on the print wiring board 221 so that the distance D2 is equal to the center-to-center distance D1.

It is preferable that the distance D5 between the two parallel lines is as short as possible. For this reason, it is preferable that the distance D6 between the long side of one of the adjacent array chips 220 and the long side of the other of the adjacent array chips 220 is as short as possible, that is, the even-numbered array chips 220 and the odd-numbered array chips 220 should be disposed as close to each other as possible. For example, the distance D6 between the array chips 220 is selected to be in the range of 10 to 50 µm.

Wire bonding pads 226 are formed on longitudinal end portions 225 of the array chip 220 where no light emitting portions 224 are formed, and wire bonding pads 227 are formed on the print wiring board 221. Au wires 228 connect between the wire bonding pads 226 and corresponding wire bonding pads 227.

Figure 15:
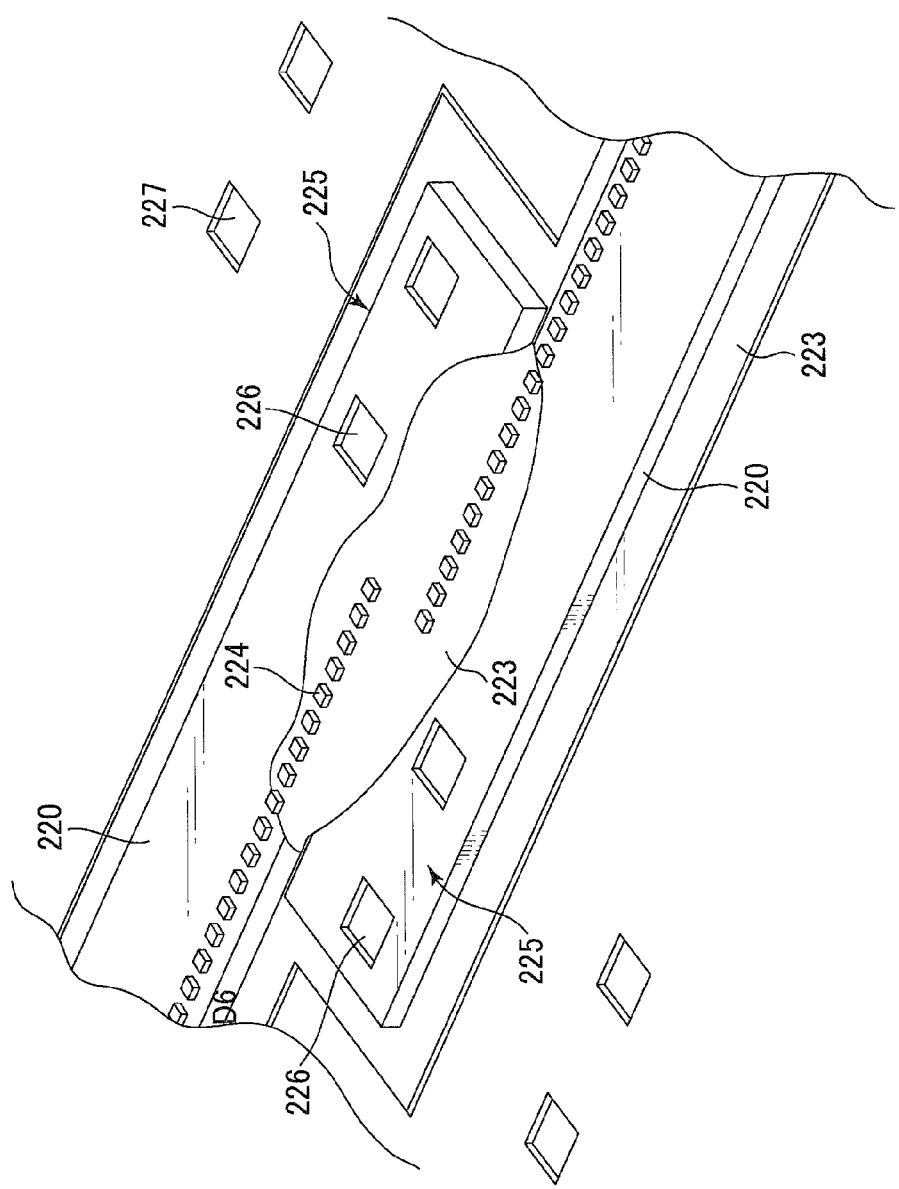
FIG. 15 illustrates how the adhesive climbs up the gap between adjacent array chips of the comparison COB and flows on the array chips.

FIG. 15 illustrates how the adhesive climbs up the gap between adjacent array chips of the comparison COB and flows on the array chips.

The adhesive 223 climbs up the gap between the adjacent array chips 220 to the top surface of the adjacent array chips 220, contaminating the light emitting portions 224 and/or the wire bonding pads 226. Contamination of the light emitting portions 224 decreases available light power and contamination of the bonding wire pads 226 impairs mechanical strength of the wire bonding portion to decrease.

Figure 16:
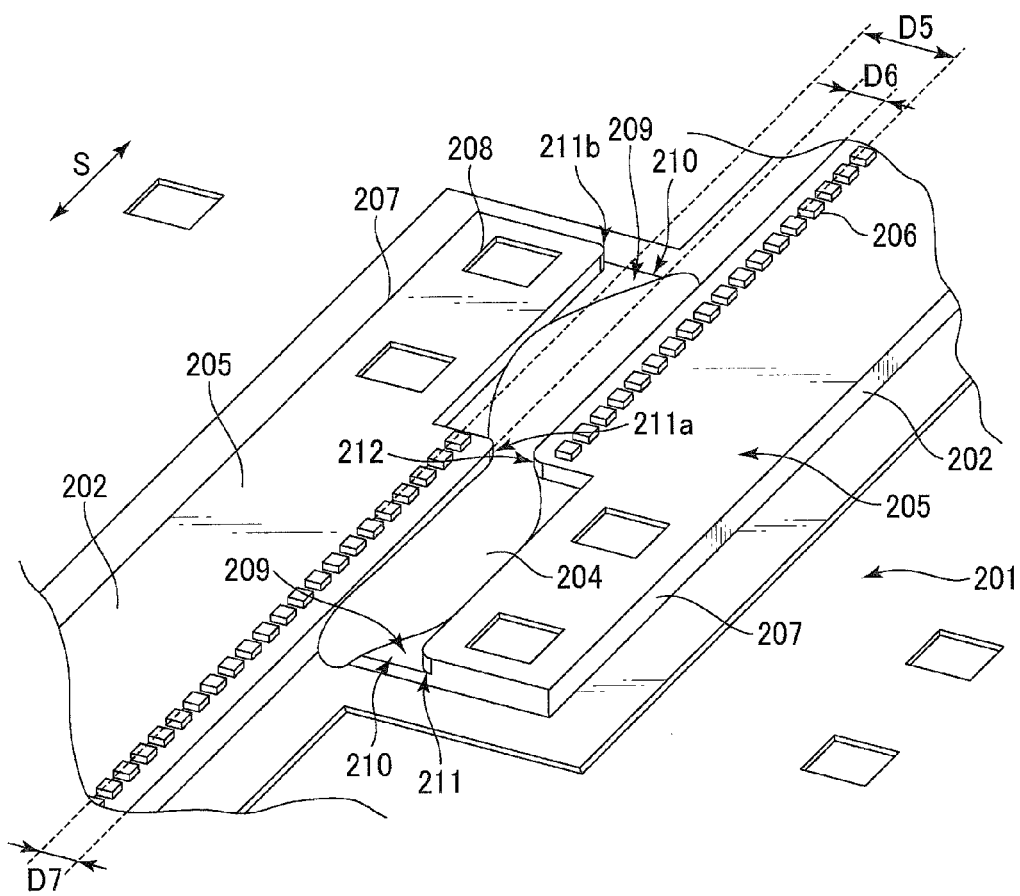
FIG. 16 illustrates how the adhesive climbs up and flows on the surface of the adjacent array chips of the COB according to the second embodiment.

FIG. 16 illustrates how the adhesive 223 climbs up and flows on the surface of the adjacent array chips 202 of the COB 220. The distance D6 between the adjacent array chips 202 is equal to that between the adjacent array chips 202 of the comparison COB 222, and the adhesive 204 is applied to the entire back surface of the array chip. However, as shown in FIG. 16, the adhesive 204 climbs up the gap between the adjacent array chips 202 due to capillary action, and is guided to flow to the recessed surface 209 of the terraced portion 210, thereby preventing the adhesive 204 from climbing onto the top surface 205.

The COB 200 of the second embodiment does not place any limitation on an area in the back surface of the array chip 202 to which the adhesive may be applied, but allows the adhesive 204 to be applied to the entire back surface of the array chip 202 so that the entire back surface of the array chip 202 can be securely bonded to the print wire board 201. This prevents the end portion of the back surface of the array chip 202 from being uplifted from the print wiring board 201. The COB 200 also prevents the corners and edges of the array chip 202 being chipped or the array chip 202 being inclined relative to the print wiring board 201.

The fact that the back surface of the array chip 202 can be securely bonded to the print wire board 201 is advantageous in that the heat generated by the array chip 202 can be uniformly conducted to the print wiring board 201, hence uniform heat dissipation across the array chip 202.

For the COB 200 according to the second embodiment, the distance D6 between adjacent array chips 202 is shorter than the comparison COB 222 but the adhesive 204 that climbs up the gap between the adjacent array chips 202 can be bypassed to the terraced portion 210. Thus, the distance D7 between the long side of the array chip 202 and the line of light emitting portions close to the long side may be longer than the comparison COB 200, providing more freedom in arranging the light emitting portions on the array chip 202.

The terraced portion 210 has the L-shaped wall 211 that partially surrounds the recessed surface 209. The L-shaped wall 211 has a rounded portion 211b, which is further effective in providing as wide a gap between adjacent array chips 202 as possible in the vicinity of the longitudinal end of the array chips 202, thereby promoting the adhesive 204 to flow to the recessed surface 209.

The L-shaped wall 211 also has a rounded portion 211a, which is further effective in providing as wide a gap between adjacent array chips 202 as possible in the vicinity of the endmost light emitting portions, thereby promoting the adhesive to flow to the recessed surface 209.

When the array chips 202 have been mounted on the print wiring board 201, the terraced portion 210 of one of adjacent array chips 202 faces the light emitting portions 206 closest to the endmost light emitting portion 206x of the other of the adjacent array chips 202. Thus, the adhesive 204 climbs up the gap between the adjacent array chips 202, then flows on the recessed surface 209, and finally flows down to the print wiring board 201 from the end of the terraced portion 210 at the longitudinal end of the array chip 202. The rounded portion 211a of the L-shaped wall 211 is effective in widening the area of the recessed surface 209 at the longitudinal end of the array chip 202, permitting the adhesive 204 to smoothly flow onto the print wiring board 201.

As described above, the second embodiment still provides the same advantages as the first embodiment when the array chips are aligned in the main scanning direction S such that even-numbered array chips 202 are staggered with respect to odd-numbered array chips 202 and long sides of adjacent array chips face each other and are overlapped. In other words, the second embodiment prevents contamination of array chips 202 due to an adhesive without sacrificing reliable operation of the array chips 202, and provides more freedom in arranging the light emitting portions 206 on the array chip 202.

Third Embodiment

A third embodiment differs from the second embodiment in that an additional terraced portion is formed in a light emitting element array chip. The basic configuration of an LED print head 8 according to the third embodiment is the same as that of the first and second embodiments, and their detailed description is omitted. A description will given of only a chip-on-board (COB) 300 according to the third embodiment.

{Configuration of COB}

Figures 17A, 17B:
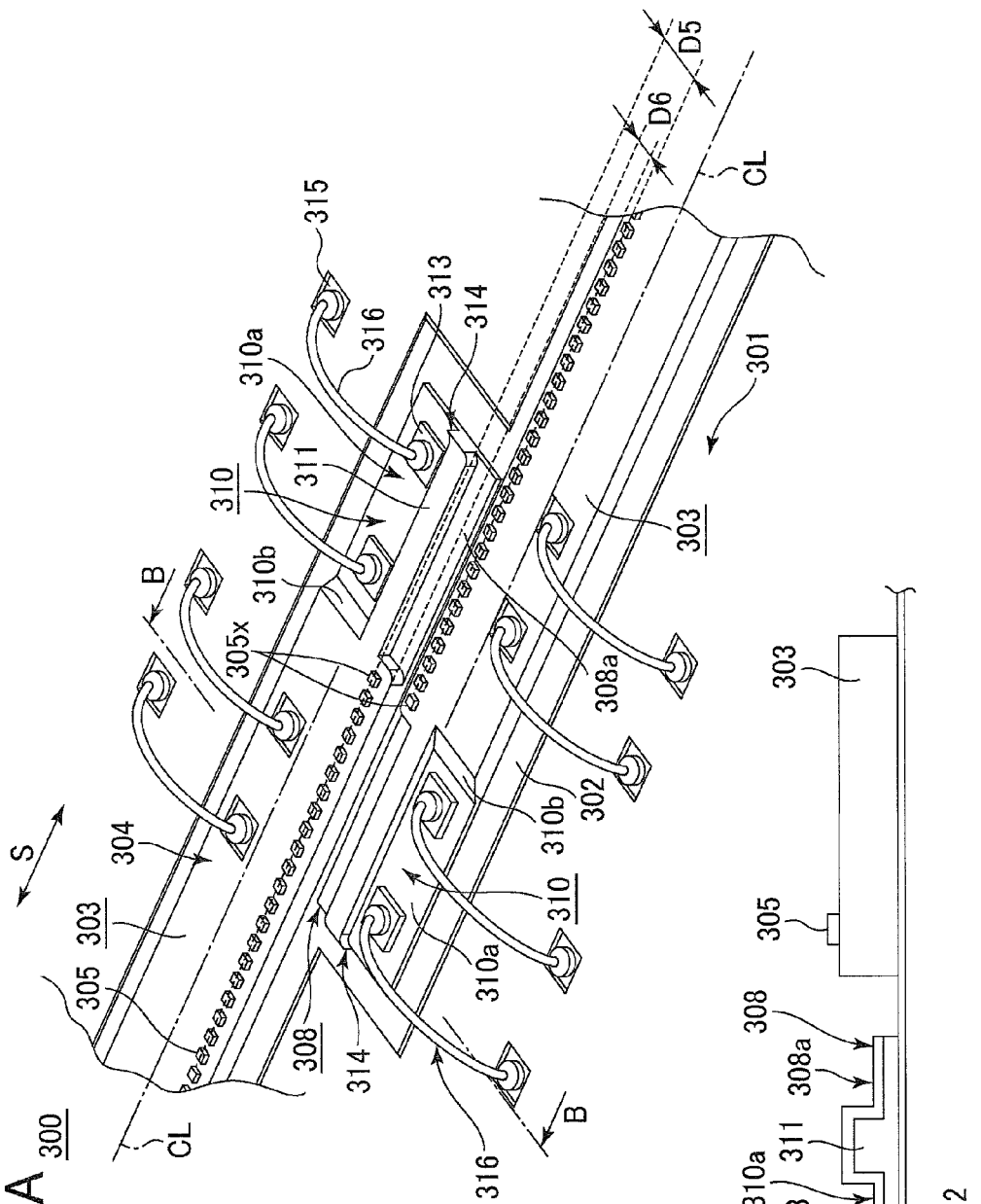
FIG. 17A is a partial perspective view of a COB according to a third embodiment.
FIG. 17B is a cross-sectional view taken along a line B-B in FIG. 17A.
Figure 17C:
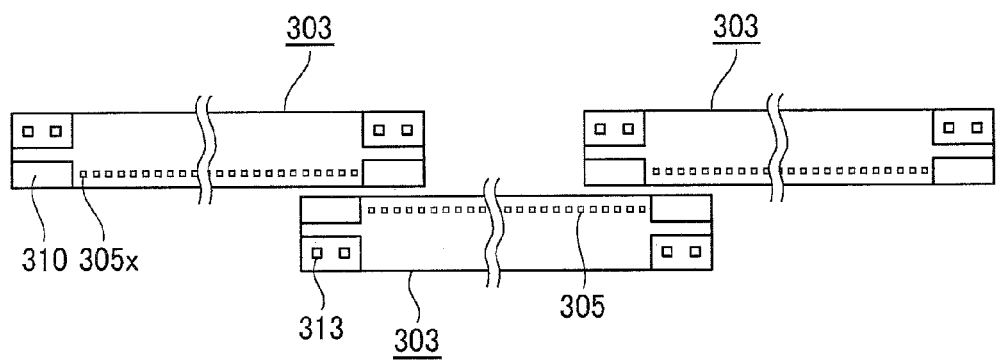
FIG. 17C illustrates the positional relationship among two consecutive odd-numbered array chips and an even numbered array chip between the two consecutive odd-numbered array chips.

FIG. 17A is a partial perspective view of the COB 300. FIG. 17B is a cross-sectional view taken along a line B-B in FIG. 17A. FIG. 17C illustrates the positional relationship among two consecutive odd-numbered array chips and an even numbered array chip between the two consecutive odd-numbered array chips. A plurality of rectangular plate-like array chips 303 are aligned in a main scanning direction S of an LED printer 1 or in a longitudinal direction of the LED print head 8, and securely bonded to a print wiring board 301. The array chips 303 are aligned in the main scanning direction S so that a line of even-numbered array chips 303 extends parallel to a line of odd-numbered array chips 303, the even-numbered array chips are staggered with respect to the odd-numbered array chips 303, and long sides of adjacent array chips face each other in an overlapped relation just as in the second embodiment.

Just as in the second embodiment, the array chip 303 may be formed on a GaAs substrate or an IC driver circuit substrate. The array chip 303 may have a thickness in the range of 300 to 600 μm. A plurality of light emitting portions 305 are aligned in a straight line on a top surface 304 of the array chip 303, and are arranged at intervals of about 42.3 μm (600 dpi) or about 21.2 μm (1200 dpi).

The rectangular array chip 303 has long sides and short sides. A line of the light emitting portions 305 is disposed closer to one of the long sides than a longitudinally extending center line CL of the array chip 303, and extends in a direction parallel to the center line CL. The array chip 303 has a small terraced portion 308 and a large terraced portion 310 formed in the top surface 304 at each longitudinal end portion of the array chip 303 where no light emitting portion is formed, the small and large terraced portions 308 and 310 defining a peninsula-shaped portion 311. The small terraced portion 308 and the large terraced portion 310 extend in directions parallel to the center line CL further than the endmost light emitting portion 305x to the longitudinal end of the array chip 303. The peninsula-shaped portion 311 extends in a direction parallel to the center line CL. A rectangular recessed surface 310a is recessed from the top surface 304, and is substantially parallel to the top surface 304. In other words, the recessed surface is lower than the top surface 304 by a predetermined distance. A surface 308a is also recessed from the top surface 304.

Just as in the first and second embodiments, the terraced portions 308 and 310 can be formed by partially etching away the surface 304 simultaneously, thereby defining the peninsular-shaped portion 311.

A wall 310b slopes down from the top surface 304 to the recessed surface 310a, thereby connecting the top surface 304 and the recessed surface 310a. In other words, the wall 310 makes an obtuse angle with the recessed surface 310a. Thin film wiring patterns (not shown) are formed on the sloped wall 310b, and electrically connect the wire bonding pads 313 to the light emitting portions 305. The sloped wall 310b is formed of an organic insulating film, which can be formed by photolithography. Alternatively, if the array chip 303 is fabricated of a GaAs substrate, the etching rate in a vertical direction and in a horizontal direction may be independently adjusted to form a sloped surface. If the array chip 303 is fabricated from an Si substrate, the etching rate in a vertical direction and in a horizontal direction may be independently adjusted to form a sloped surface.

Figure 17D:
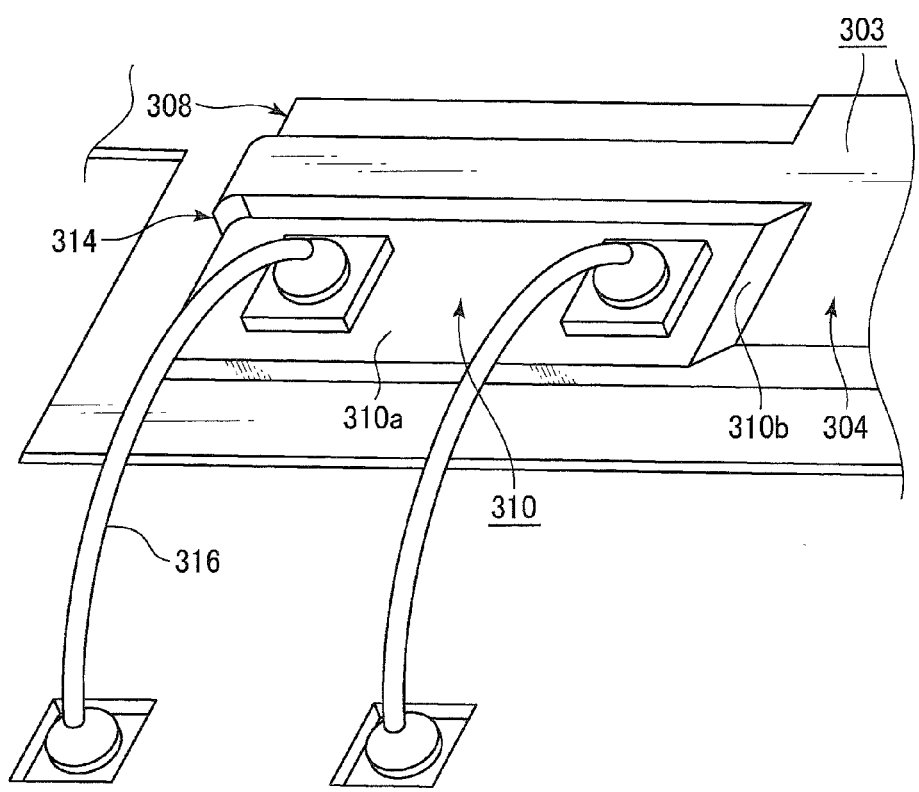
FIG. 17D is an expanded view of a projection.
Figure 17E:
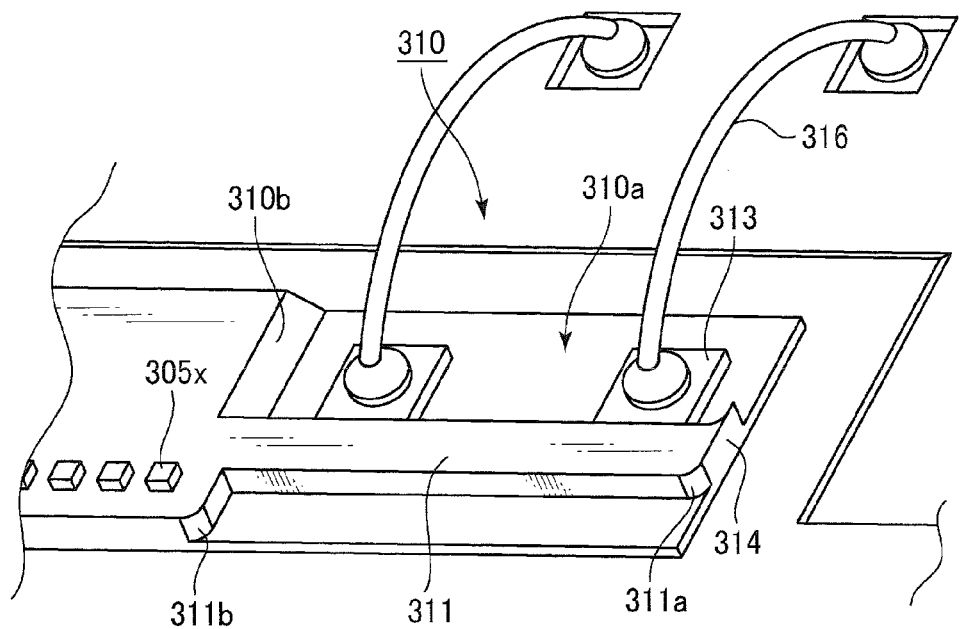
FIG. 17E is an expanded view of rounded corners.

FIG. 17D is an expanded view of a projection. FIG. 17E is an expanded view of rounded corners.

Just as in the second embodiment, an L-shaped wall has rounded arrises or corners, and connects the top surface 304 and the surface 308a. The array chip 303 may have a projection 314 at the longitudinal ends of the array chip 303, the projection 314 projecting from the peninsula-shape portion 311 in a direction perpendicular to the center line CL. This projection 314 effectively prevents the adhesive 302 from climbing onto the surface 310a, and prevents the wire bonding pads 313 from being contaminated.

As described above, the array chips 303 are mounted on the print wiring board 301 so that the even-numbered array chips 303 are staggered with respect to the odd-numbered array chips 303 and the terraced portion 308 of one of adjacent array chips 303 faces the light emitting portions 305 on the other of the adjacent array chips 303.

The adjacent array chips 305 should be arranged so that the distance D5 between a line passing through the center of the light emitting portions 305 formed on one of adjacent array and a line passing through the center the light emitting portions 305 formed on the other of the adjacent array chips. 303 is as short as possible. The distance D6 between the long sides of the adjacent array chips 305 which directly face each other should also be as short as possible. In practice, the distance D6 is selected to be in the range of, for example, 10 to 50 μm.

Just as in the first and second embodiments, the adhesive 302 may be transferred onto the print wiring board 301 using the stamp function of a die bonder (not shown). Alternatively, a dispenser (not shown) may be used to form a layer of the adhesive 302 on predetermined areas on the print wiring board 301. The layer of the adhesive 302 is formed so that the entire back surface of the array chip 303 is in contact with the layer of the adhesive 302.

As described above, the array chip 303 carries wire bonding pads 313 formed on the recessed surface 310a through which data can be inputted from and outputted to external driver circuits. The print wiring board 301 carries wire bonding pads 315 through which data can be inputted from and outputted to the array chips 303. A bonding wire 316 connects a wire bonding pad 313 to a corresponding wire bonding pad 315. A line of wire bonding pads 313 and a line of wire bonding pads 315 extend in directions substantially parallel to the longitudinal center line CL or the longitudinal direction of the array chip 303, and are spaced apart by a predetermined distance.

The wire bonding pads 313 formed on the array chip 303 and the wire bonding pads 315 formed on the print wiring board 301 are electrically connected by means of Au wires 316. Balls 317 are formed on the wire bonding pads 313 and 315, so that the top of the balls 317 after wire bonding should be lower than the top surface of the peninsula-shaped portion 311.

In practice, the surface 310a is lower than the top surface 304 by the sum of the thickness of the bonding pad 313 and the height of the ball 317.

A ROM, chip capacitors, and connectors through which the data is communicated between the LED printer 1 and the LED print head 8, which are not shown, are mounted on the print wiring board 301, thereby configuring the COB 300 for the LED print head 8. Just as in the first and second embodiment, the COB 300 is assembled to the frame 30 of the LED print head 8.

Effects of Third Embodiment

Just as in the second embodiment, the third embodiment also provides effects of forming the terraced portion 308 on a side of the peninsula-shaped portion opposite the terraced portion 310, and its detailed description is omitted. Effects of the third embodiment will be described.

The third embodiment has the terraced portions 308 and 310, which defines the peninsula-shaped portion 311 formed between the terraced portions 308 and 310. The wire bonding pads 313 are formed on the recessed surface 310a.

The terraced portion 308 of one of adjacent array chips 303 faces the light emitting portions 305 closest to the endmost light emitting portion 305x of the other of the adjacent array chips 303.

Figure 18:
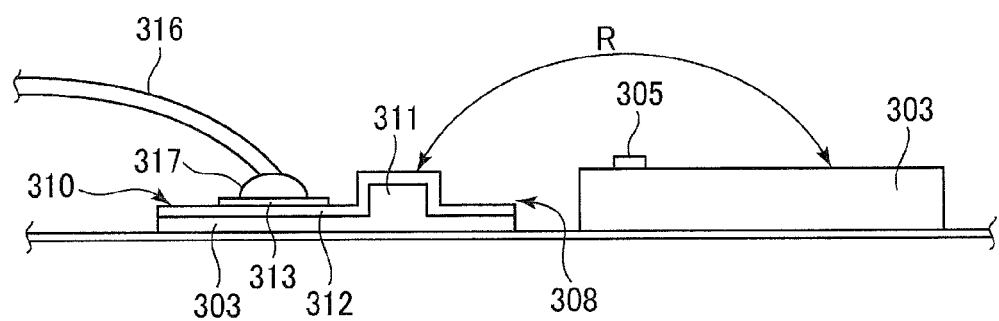
FIG. 18 illustrates that a ball is out of an angular range in which the light emitting portions emit light.

FIG. 18 illustrates that the ball 317 is out of an angular range R in which the light emitting portions emit light. If the ball 317 reflects the light emitted from the light emitting portions 305, the reflected light may illuminate the charged surface of the photoconductive drum 5, which causes streaks and lines in the print results leading to poor print quality. To avoid such adverse effects, the Au bonding wires 316 on one of adjacent array chips 303 extend from the wire bonding pads 313 in such a direction as to be away from the light emitting portions 305 on the other of the adjacent array chips 303. As a result, the ball 317 is out of the angular range R in which light emitting portions 305 emits light as shown in FIG. 18, so that there is no chance of the ball 317 reflecting the light emitted from the light emitting portions 305.

A recessed surface (not shown) may be formed in the longitudinal end portions of the array chip 303 in which no light emitting portions are fabricated, and the balls 317 may be formed in the recessed surface, thereby hiding the balls 317. The recessed surface may have a depth lager than the sum of the height of the balls 317 and the bonding pad 213. This configuration is also effective in preventing the ball 317 from reflecting the light emitted from the light emitting portions 305. Each recessed surface 304 may accommodate a corresponding ball 317. Alternatively, a larger recessed surface may be formed in which a plurality of wire bonding pads 313 and corresponding balls 317 are accommodated.

In the third embodiment, the Au wires 316 are connected to the wire bonding pads 313 by ball bonding. Instead, stitch bonding may be employed. The wire bonding pads 313 require to be larger in stitch bonding than in ball bonding. Therefore, the width of the array chips 303 also requires to be larger in stitch bonding than in ball bonding. On the other hand, the height of stitched portions may be lower than that of the balls 317, which is effective in preventing the ball 317 from reflecting light emitted from the light emitting portions 305. In addition, the depth of the recessed surface from the top surface 304 may be as shallow as, for example, 10 μm.

{Modifications}

Modification #1

The first, second, and third embodiments have been described in terms of the LED print head 8 mounted on the LED printer 1. The invention is not limited to the LED print head 8, and may also be applied to other exposing heads that use light emitting portions other than LEDs, for example, contact image sensors (CIS), which are used as reading heads used for, for example, scanners.

When a CIS is employed, the reading head may have a configuration in which light receiving element array chips, each having a plurality of light receiving portions aligned in one dimension, are securely bonded using an adhesive. The present invention may also be applicable to this type of CIS.

The first, second, and third embodiments have been described in terms of COB 133, COB 200, and COB 300, respectively. The invention is not limited to these, and may also be applicable to apparatus having a configuration in which semiconductor chips are securely bonded to a circuit board using an adhesive. The semiconductor chip may be any type in which a plurality of semiconductor portions are fabricated in its surface.

The first, second, and third embodiments have been described in terms of the LED printer 1. The invention may also be applied to printers and image forming apparatus that employ exposing heads whose light emitting portions are other than LEDs. The image forming apparatus include scanners, facsimile machines, multi-function printers (MFPs), and copying machines. The scanners employ, for example, reading heads such as compact image sensors. The first, second, and third embodiment have been described as using Au wires 140, 203, and 316, respectively. However, any electrically conductive wires including a Cu wire can be used.

Modification #2

The invention is not limited to the first, second, and third embodiments but modifications may be made by combining these embodiments or using a part of these embodiments.

Fourth Embodiment

A fourth embodiment differs from the first to third embodiments in the configuration of semiconductor light emitting element array chip. The fourth embodiment will be described mainly in terms of chip-on-board (COB).

A description will be given of the print wiring board 434 and the array chips 435 mounted on the print wiring board 434. FIG. 19A is a partial perspective view of the chip-on-board module 433. FIG. 19B is a cross-sectional view taken along a line C-C in FIG. 19A.

Referring to FIGS. 19A and 19B, a plurality of rectangular plate-like array chips 435 are mounted on the surface of the print wiring board 434 using an electrically conductive or an electrically non-conducive adhesive 440. The array chips 435 are aligned in the main scanning direction shown by arrow S. Light emitting portions 442, which are light emitting diodes, are formed in the surface 441 of each array chip 435.

The light emitting portions 442 are formed of a GaAs compound semiconductor, and are aligned in a one dimension at intervals of 42.3 μm (i.e., a resolution of 600 dpi) or at intervals of 21.2 μm (i.e., a resolution of 1200 dpi). Each light emitting portion 442 may be implemented as a light emitting diode (LED) by forming a PN junction of a P-type semiconductor and an N type semiconductor. Alternatively, the light emitting portions 442 may be Thyristors that take the form of a PNPN junction or an NPNP junction.

The array chip 435 is rectangular, and has a longitudinal center line CL, long sides, and short sides. A straight line of the light emitting portions 442 extends in a direction parallel to the long sides and is closer to one of the long sides of the array chip 435 than the longitudinal center line CL, while a straight line of the wire bonding pads 447 extends in a direction parallel to the long sides and is closer to the other of the long sides than the longitudinal center line CL. The wire bonding pads 447 are aligned at predetermined intervals.

Referring to FIG. 19A, the array chip 435 has an extended portion 443 at each of the longitudinal end portions of the array chip 435, the extended portion 443 extending a distance D8 of 100 to 500 μm from the endmost light emitting portions 442x. The array chip 435 also has a stepped portion or terraced portion 445 formed in the extended portion 443. The terraced portion 445 has a transition or wall 445b that extends from the top surface 441 to a recessed surface 445a that is recessed from the top surface 441. For example, the recessed surface 445a is lower than the top surface 441 by a distance of 20 to 200 μm. The recessed surface 445a extends from the wall 445b to the longitudinal end of the array chip 435 and from the center line CL to one of the longitudinal sides of the array chip 435.

An insulating film 446, which is formed of, for example, Si or SiO2, is formed on the recessed surface 445a, and a plurality of (e.g., two) wire bonding pads 447 are formed on the insulating film 446 at predetermined intervals. Forming the terraced portion 445 in the extended portion 443 leaves a peninsula-shaped portion 443a. The terraced portion 445 and the peninsula-shaped portion 443a are aligned side by side in a direction perpendicular to the main scanning direction S of the LED printer 1. The peninsula-shaped portion 442a extends to the longitudinal end of the array chip 435. Forming the terraced portion 445 and forming the wire bonding pads 447 on the recessed surface 445a is advantageous in that the short sides of the array chip can be shorter and a larger number of array chips 435 can be diced from a single wafer.

If the array chip 435 is formed on a GaAs substrate, the terraced portion 445 may be formed as follows: A wafer is diced into individual rectangular array chips 435. A photoresist material is applied to areas of the array chip 435 except for an area in which the terraced portion 445 is to be formed. The passivation film or interlayer dielectric film is removed by CF4 dry etching from the area in which the terraced portion 445 is to be formed, so that the GaAs substrate is exposed. The exposed GaAs substrate is subjected to wet etching using an etchant, which is a mixed solution of sulfuric acid, hydrogen peroxide water, and water. The array chip 435 is etched to a depth of 20 µm to 200 µm. The photoresist material is then removed from the array chip 435, thereby forming the terraced portions 445 in the array chip 435.

If the array chip 435 takes the form of an Si IC driver circuit substrate, the terraced portions 445 may be formed as follows: The driver circuit is designed such that no circuit occupies areas in which the terraced portions 445 are to be formed. Just as in the GaAs substrate, a photoresist material is applied to areas of the array chip 435 except for the areas in which the terraced portions 445 are to be formed. The passivation film or interlayer dielectric film in the areas in which the terraced portions 445 are to be formed is removed by CF4 dry etching, so that the Si substrate is exposed. The exposed Si substrate is then subjected to chemical dry etching that uses a gas, for example, SF6, thereby etching the array chip 435 to a depth of 20 µm to 200 µm. The photoresist material is then removed from the array chip 435, thereby forming the terraced portions 445 in the array chip 435.

A wall 445b slopes down from the top surface 441 to the recessed surface 445a, thereby connecting the top surface 441 and the recessed surface 445a. Thin film wiring patterns (not shown) are formed on the sloped wall 445b, and electrically connect the wire bonding pads 447 to the light emitting portions 442.

The sloped wall 445b is formed of an organic insulating film, which can be formed by photolithography. Alternatively, if the array chip 435 is fabricated of a GaAs substrate, the etching rate in a vertical direction and in a horizontal direction may be independently adjusted to form the sloped wall 445b. If the array chip 435 is fabricated from an Si substrate, the etching rate in a vertical direction and in a horizontal direction may be independently adjusted to form the sloped wall 445b.

Using an adhesive 440, the array chips 435, which have the terraced portions 445 formed thereon, are mounted on the wiring board 434 formed of, for example, composite epoxy material (CEM3) or flame retardant 4 (FR4), and are aligned in the longitudinal direction parallel to the center line CL of the array chip 435.

Figure 19C:
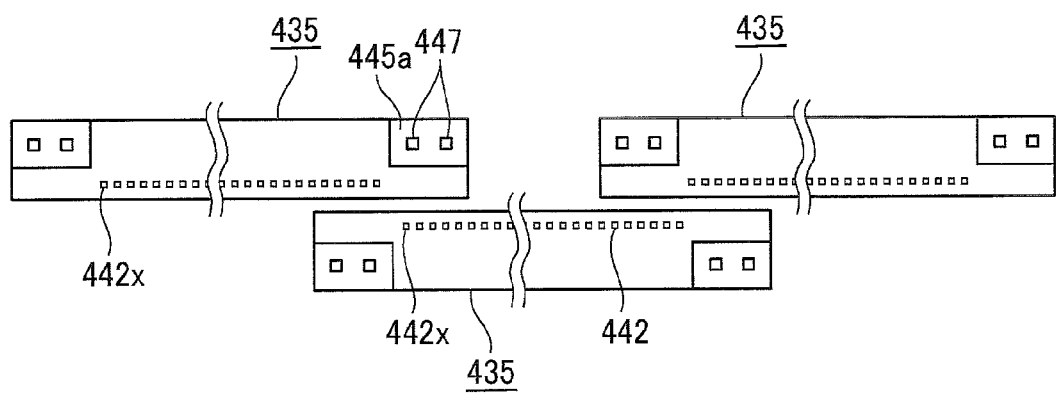
FIG. 19C illustrates the positional relationship among two adjacent odd-numbered array chips and an even numbered array chip between the two adjacent odd-numbered array chips.

FIG. 19C illustrates the positional relationship among two adjacent odd-numbered array chis and an even numbered array chip between the two adjacent odd-numbered array chips. The array chips 435 mounted on the print wiring board 434 include a line of even-numbered array chips 402 and a line of odd-numbered array chips 435, the even-numbered array chips 435 being staggered with respect to the odd-numbered array chips 435, so that the even-numbered array chips 435 and the odd-numbered array chips 435 are overlapped with each other.

When the array chips 435 have been mounted on the print wiring board 434, the peninsula-shaped portion 443a of one of adjacent array chips 435 faces the light emitting portions 442 closest to the endmost light emitting portion 442x of the other of the adjacent array chips 435.

One of two parallel lines perpendicular to the center line CL passes through the center of the endmost light emitting portion 442x of one of the adjacent array chips 435, and the other of the two parallel lines passes through the center of the endmost light emitting portion 442x of the other of the adjacent array chips 435 such that the distance D2 between the two parallel lines is equal to a center-to-center distance D1 between adjacent light emitting portions 442 in each array chip 435.

It is preferable that the adjacent array chips 435 are mounted on the print wiring board 434 so that the distance D3 between a line parallel to the center line CL and passing through the light emitting portions 442 of one of the adjacent array chips 435 and a line parallel to the center line CL and passing through the light emitting portions 442 of the other of the adjacent array chips is as short as possible. If the distance D3 can be sufficiently short, the amount of light emitted from the even-numbered array chips 435 and incident on a rod lens 36 can be substantially equal to the amount of light emitted from the odd-numbered array chips 435 and incident on the rod lens 36.

Thus, it is preferable that the distance D3 between the directly facing long sides of the adjacent array chips 435 is as short as possible. Thus, achieving the shorter distance D3 in the fourth embodiment provides a shorter distance D4. As a result, the wire bonding pads 447 of one of the adjacent array chips 435 may be closer to the light emitting portions 442 of the other of the adjacent array chip 435. The distance between a line passing through the center of the wire bonding pads 447 and a line passing through the center of the light emitting portions 442 is selected to be about 100 µm.

The wire bonding pads 448 are formed on the print wiring board 434, and the wire bonding pads 447 are formed on the array chips 435 in correspondence with the wire bonding pads 448. The wire bonding pads 447 and 448 are spaced apart by a predetermined distance in directions perpendicular to the main scanning direction S.

Au wires 449 connect the wire bonding pads 447 and corresponding bonding pads 448. The Au wire 449 is bonded to the bonding pad 447 by ball bonding or stitch bonding. The bonding pads 447 can be smaller when ball bonding is employed than when stitch bonding is employed. In fact, a 50 µm square bonding pads 447 can be used in ball bonding. The ball 450 of the Au wire 449 is a substantially spherical ball 450 having a diameter of 50 µm and a height greater than 20 µm. The top surface 441 is above the top of the ball 450. The depth of the recessed surface 445a from the top surface 441 is selected to be larger than the sum of the height of the ball 450 and the thickness of the bonding pads 447.

If stitch bonding is employed, the size of the wire bonding pads 447 should be more than 80 µm square. The height of stitched portion of the Au wire 449 can be lower than the diameter of the Au wire 449, and well below the top surface 441.

The print wiring board 434 includes a ROM, chip capacitances, and connectors through which the data is communicated between the LED printer 1 and the LED print head 8, thus configuring the COB 433 for the LED print head 8. This COB 433 is assembled to a frame 30 of the LED print head 8.

Effects of Fourth Embodiment

Effects of forming the terraced portions 445 in the array chip 435 will be described. The effects will be described by comparing the COB 433 according to the fourth embodiment with a comparison COB 462 whose array chips 460 have no terraced portions.

FIG. 20A is a perspective view of the comparison COB 462 on which semiconductor light emitting element array chips 460 are mounted. FIG. 20B is a cross-sectional view taken along a line D-D in FIG. 20A. The comparison COB 462 has the same configuration as the COB 433 except that the array chips 460 have no terraced portion formed therein.

The comparison COB 462 includes a plurality of array chips 460 bonded to the print wiring board 461 using an adhesive 463 and aligned generally in a line. The array chips 460 are aligned generally in two directions parallel to the center line CL of the array chips 460, so that even-numbered array chips 460 lie in one of two directions and odd-numbered array chips 460 lie in the other of the two directions. The even-numbered array chips 460 are staggered with respect to the odd-numbered array chips 460, so that the even-numbered array chips 460 and the odd-numbered array chips 460 are overlapped with each other. One of two parallel lines perpendicular to the center line CL passes through the center of the endmost light emitting portion 464x of one of the adjacent array chips 460, and the other of the two parallel lines passes through the center of the endmost light emitting portion 464x of the other of the adjacent array chips 460. The adjacent array chips 460 are arranged such that the distance D2 between the two parallel lines is equal to a center-to-center distance D1 between adjacent light emitting portions 464x in each array chip 460.

The distance D3 between the line of light emitting portions 464 of the even-numbered array chips 460 and the line of light emitting portions 464 of the odd-numbered array chips 460 should be as short as possible, and is selected to be in the range of 50 to 100 μm. Accordingly, the distance D4 between the long sides of the adjacent array chips 460 should be as short as possible, and is selected to be in the range of 10 to 50 μm.

Thus, the wire bonding pads 466 formed on an extended portion 465 of one of the adjacent array chips 460 may also be closer to the light emitting portions on the other of the adjacent array chips 460. The extended portion 465 extends a distance of D9. Likewise, the Au wire 467 on one of the adjacent array chips 460 may also be closer to the light emitting portions 464 on the other of the adjacent array chips 460.

A plurality of bonding pads 468 are formed on the print wiring board 61 in correspondence with the wire bonding pads 466 formed on the array chips 460. The Au wire 467 connects each wire bonding pad 466 to a corresponding wire bonding pad 468. As described above, the Au wire 467 should be bonded by ball bonding so that the wire bonding pad 466 occupies as small an area as possible, in which case the height of the ball 469 is usually higher than 20 μm.

When the array chips 460 of the comparison COB 462 have been mounted on the print wiring board 461, the extended portion 465 of one of adjacent array chips 460 faces the light emitting portions 464 closest to the endmost light emitting portion 464x of the other of the adjacent array chips 460.

The balls 469 sit on the bonding pads 466 formed on the top surface 470 of the array chip 460. Thus, the light emitted from the light emitting portions 464 reaches the balls 469, which in turn reflects the light.

Figure 21:
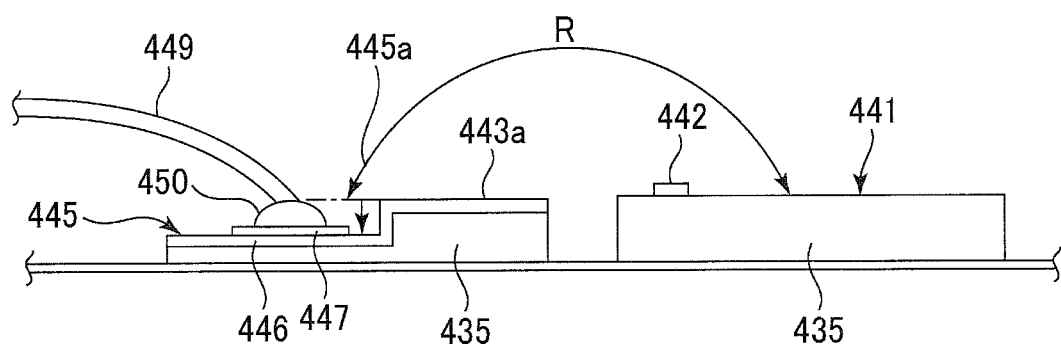
FIG. 21 illustrates an angular range R in which the light emitting portions emit light.

FIG. 21 illustrates an angular range R in which the light emitting portions 442 emit light. In contrast, the COB 433 according to the fourth embodiment has the following configuration. The distance D3 and the distance D4 are the same as the comparison COB 462. The wire bonding pads 447 are formed on the recessed surface 445a such that the top of the balls 450 is below the top surface 441 as shown in FIG. 21, i.e., the balls 450 are out of an angular range R in which the light emitting portions 442 emit light. The difference in height between the top surface 441 and the recessed surface 445a is selected to be in the range of 20 to 200 μm.

Therefore, there is no chance of the balls 450 reflecting the light emitted from the light emitting portions 442.

As described above, a light-blocking wall is not formed on the top surface 441 of the array chip 435, which is intended to prevent the light emitted from the light emitting portions 442 from reaching the balls 450. Instead, the recessed surface 445a is formed below the top surface 441 to prevent the light emitted from the light emitting portions 442 from reaching the balls 450. This simple configuration ensures that the balls 450 are out of the angular range R in which the light emitting portions 442 emit light, and is effective in preventing the balls 450 from reflecting the light emitted from the light emitting portions 442.

With the comparison COB 462, the balls 469 reflect the light from the light emitting portions 464, and the reflected light may illuminate the charged surface of a photoconductive drum 5 (not shown) of the LED printer 1, causing streaks and lines in the print results, thus leading to poor print quality. In contrast, the COB 433 according to the fourth embodiment minimizes the chance of the balls 450 reflecting the light emitted from the light emitting portions 442, and therefore minimizes streaks and lines in the print results and not leading to poor print quality.

In the fourth embodiment, the Au wires 449 are connected to the wire bonding pads 447 by ball bonding. Instead, stitch bonding may be employed. The wire bonding pads 447 require to be larger in stitch bonding than in ball bonding. Therefore, the array chips 435 requires to have a larger width (i.e., short sides) in stitch bonding than in ball bonding. However, the height of stitched portions may be lower than that of the balls 450, which is effective in preventing the balls 450 from reflecting light emitted from the light emitting portions 442. In addition, the depth of the recessed surface 445a from the top surface 441 may be as shallow as, for example, 10 μm.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A semiconductor apparatus comprising:
   a rectangular plate-like body including a first long side, a second long side parallel to the first long side, a first short side, and a second short side parallel to the first short side and including a major surface;
   a plurality of light emitting portions formed in the major surface, and aligned in a straight line; and
   a first terraced portion and a second terraced portion which are formed in the major surface except areas in which the plurality of the light emitting portions are formed, the areas including a first longitudinal end portion of the body and a second longitudinal end portion opposite to the first longitudinal end portion of the body,
   wherein the first terraced portion is formed in the first longitudinal end portion leaving a first peninsula-shaped portion, the first terraced portion extending to the first short side and to the first long side, the first peninsula-shaped portion extending to the first short side and to the second long side;

wherein the second terraced portion is formed in the second longitudinal end portion leaving a second peninsula-shaped portion, the second terraced portion extending to the second short side and to the first long side, the second peninsula-shaped portion extending to the second short side and to the second long side;

wherein the first terraced portion extends over a first area along the first peninsula-shaped portion, the first area being larger than a gap between two adjacent light emitting portions; and wherein the second terraced portion extends over a second area along the second peninsula-shaped portion, the second area being larger than the gap between two adjacent light emitting portions.

2. The semiconductor apparatus according to claim 1, further comprising:

a third terraced portion formed in the first longitudinal end portion beside the first terraced portion, defining a third peninsula-shaped portion between the third terraced portion and the first terraced portion, the third terraced portion extending to the first short side and to the second long side; and a fourth terraced portion formed in the second longitudinal end portion beside the second terraced portion, defining a fourth peninsula-shaped portion between the fourth terraced portion and the second terraced portion, the fourth terraced portion extending to the second short side and to the second long side.

3. The semiconductor apparatus according to claim 2, wherein the light emitting portions aligned in the straight line include endmost light emitting portions, at least one of the endmost light emitting portions being positioned on one of the first, second, third and fourth peninsula-shaped portions.

4. The semiconductor apparatus according to claim 1, wherein the plurality of light emitting portions are formed in the major surface between the first terraced portion and the second terraced portion, the light emitting portions being aligned in a straight line substantially parallel to a longitudinal center line of the body and being closer to the first long side than the longitudinal center line.

5. The semiconductor apparatus according to claim 4, wherein the recessed surface includes an area in which wire bonding pads are formed.

6. The semiconductor apparatus according to claim 5, wherein the major surface lies in a first plane and the recessed surface lies in a second plane substantially parallel to the first plane, the first plane and the second plane being spaced apart by at least a distance equal to a height of a ball for ball bonding mounted a corresponding pad.

7. The semiconductor apparatus according to claim 5, wherein the area is just large enough to support a wire for wire bonding.

8. The semiconductor apparatus according to claim 5, wherein the area is just large enough to support the ball.

9. The semiconductor apparatus according to claim 4, wherein each of the first terraced portion and the second terraced portion includes a recessed surface and a wall that connects the major surface to the recessed surface, and wherein the major surface lies in a first plane and the recessed surface lies in a second plane substantially parallel to the first plane, and the wall slopes down from the major surface to the recessed surface forming an obtuse angle with the recessed surface.

10. The semiconductor apparatus according to claim 4, wherein each of the first terraced portion and the second terraced portion includes a recessed surface and a wall that connects the major surface to the recessed surface, and wherein the major surface lies in a first plane and the recessed surface lies in a second plane substantially parallel to the first plane, and the wall forms substantially right angles with the major surface and the recessed surface.

11. The semiconductor apparatus according to claim 4, wherein a plurality of bonding pads are formed on the peninsula-shaped portion.

12. An exposing unit incorporating the semiconductor apparatus according to claim 4, comprising:

a wiring board; and an adhesive layer formed to the wiring board;

a straight line of semiconductor apparatus bonded on the wiring board through the adhesive layer so that the first short side of an even-numbered semiconductor apparatus directly faces the second short side of an odd numbered semiconductor apparatus.

13. The exposing unit according to claim 12, wherein the adhesive layer is formed in an area of the wiring board so that the semiconductor apparatus are within the area.

14. An exposing unit incorporating the semiconductor apparatus according to claim 4, comprising:

a wiring board;

an adhesive layer formed to the wiring board;

a straight line of even-numbered semiconductor apparatus bonded on the wiring board through the adhesive layer;

a straight line of odd-numbered semiconductor apparatus mounted on the wiring board through the adhesive layer, and extending in a direction parallel to the straight line of even-numbered semiconductor apparatus;

wherein the even-numbered semiconductor apparatus are staggered with respect to the odd-numbered semiconductor apparatus, and the first long side of an odd-numbered semiconductor apparatus and the first long side of an even-numbered semiconductor apparatus adjacent face each other in an overlapped relation.

15. The exposing unit according to claim 14, wherein the semiconductor apparatus are arranged so that the second peninsula-shaped portion of an even-numbered semiconductor apparatus directly faces the light emitting portions of a preceding one of two consecutive odd-numbered semiconductor apparatus, and the first peninsula-shaped portion of the even-numbered semiconductor apparatus directly faces the light emitting portions of a following one of the two consecutive odd-numbered semiconductor apparatus.

16. The exposing unit according to claim 14, wherein the semiconductor apparatus are arranged so that the second terraced portion of an even-numbered semiconductor apparatus directly faces the light emitting portions of a preceding one of two consecutive odd-numbered semiconductor apparatus, and the first terraced portion of the even-numbered semiconductor apparatus directly faces the light emitting portions of a following one of the two consecutive odd-numbered semiconductor apparatus.

17. The exposing unit according to claim 14, wherein the adhesive layer is formed in an area of the wiring board so that the semiconductor apparatus are within the area.

18. The semiconductor apparatus according to claim 1, wherein the first area is larger than an arrangement pitch of the light emitting portions, and the second area is larger than the arrangement pitch of the light emitting portions.

19. An image forming apparatus, comprising:

an image bearing body;

a charging unit that charges a surface of the image bearing body;

an exposing unit incorporating the semiconductor apparatus according to claim 1, the exposing unit illuminating the charged surface of the image bearing body in accordance with print data to form an electrostatic latent image on the image bearing body; and a developing unit that supplies toner to the electrostatic latent image to develop the electrostatic latent image into a toner image.

20. A semiconductor apparatus comprising:

a rectangular plate-like body including a first long side, a second long side parallel to the first long side, a first short side, and a second short side parallel to the first short side and including a major surface;

a plurality of light emitting portions formed in the major surface, and aligned in a straight line;

a first terraced portion and a second terraced portion which are formed in the major surface except areas in which the plurality of light emitting portions are formed, the areas including a first longitudinal end portion of the body and a second longitudinal end portion opposite to the first longitudinal end portion of the body, a third terraced portion formed in the first longitudinal end portion beside the first terraced portion, defining a third peninsula-shaped portion between the third terraced portion and the first terraced portion, the third terraced portion extending to the first short side and to the second long side; and a fourth terraced portion formed in the second longitudinal end portion beside the second terraced portion, defining a fourth peninsula-shaped portion between the fourth terraced portion and the second terraced portion, the fourth terraced portion extending to the second short side and to the second long side, wherein the first terraced portion is formed in the first longitudinal end portion of the major surface leaving a first peninsula-shaped portion, the first terraced portion extending to the first short side and to the first long side, the first peninsula-shaped portion extending to the first short side and to the second long side;

wherein the second terraced portion is formed in the second longitudinal end portion leaving a second peninsula-shaped portion, the second terraced portion extending to the second short side and to the first long side, the second peninsula-shaped portion extending to the second short side and to the second long side;

wherein the light emitting portions aligned in the straight line include endmost light emitting portions, at least one of the endmost light emitting portions being positioned on one of the first, second, third and fourth peninsula-shaped portions; and wherein each of the first terraced portion, second terraced portion, third terraced portion, and fourth terraced portion includes a wall that connects the major surface to the recessed surface, the wall including rounded corners so that the wall curves to surround the peninsula-shaped portion.

21. A semiconductor apparatus comprising:

a rectangular plate-like body including a first long side, a second long side parallel to the first long side, a first short side, and a second short side parallel to the first short side and including a major surface;

a plurality of light emitting portions formed in the major surface, and aligned in a straight line;

a first terraced portion and a second terraced portion which are formed in the major surface except areas in which the plurality of light emitting portions are formed, the areas including a first longitudinal end portion of the body and a second longitudinal end portion opposite to the first longitudinal end portion of the body, a third terraced portion formed in the first longitudinal end portion beside the first terraced portion defining a third peninsula-shaped portion between the third terraced portion and the first terraced portion, the third terraced portion extending to the first short side and to the second long side; and a fourth terraced portion formed in the second longitudinal end portion beside the second terraced portion, defining a fourth peninsula-shaped portion between the fourth terraced portion and the second terraced portion, the fourth terraced portion extending to the second short side and to the second long side, wherein the first terraced portion is formed in the first longitudinal end portion of the major surface leaving a first peninsula-shaped portion, the first terraced portion extending to the first short side and to the first long side, the first peninsula-shaped portion extending to the first short side and to the second long side;

wherein the second terraced portion is formed in the second longitudinal end portion leaving a second peninsula-shaped portion, the second terraced portion extending to the second short side and to the first long side, the second peninsula-shaped portion extending to the second short side and to the second long side;

wherein the plurality of light emitting portions are formed in the major surface between the first terraced portion and the second terraced portion, the light emitting portions being aligned in a straight line substantially parallel to a longitudinal center line of the body and being closer to the first long side than the longitudinal center line; and wherein each of the first terraced portion and the second terraced portion includes a recessed surface and a wall that connects the major surface to the recessed surface, the wall including rounded corners such that the recessed surface is wider nearer the first long side and is wider nearer the first short sides.

* * * * *